US011121695B2

(12) United States Patent
Uemichi

(10) Patent No.: US 11,121,695 B2
(45) Date of Patent: Sep. 14, 2021

(54) DIPLEXER AND MULTIPLEXER

(71) Applicant: FUJIKURA LTD., Tokyo (JP)

(72) Inventor: Yusuke Uemichi, Sakura (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 16/607,480

(22) PCT Filed: Apr. 23, 2018

(86) PCT No.: PCT/JP2018/016470
§ 371 (c)(1),
(2) Date: Oct. 23, 2019

(87) PCT Pub. No.: WO2018/199029
PCT Pub. Date: Nov. 1, 2018

(65) Prior Publication Data
US 2020/0136584 A1 Apr. 30, 2020

(30) Foreign Application Priority Data

Apr. 28, 2017 (JP) .............................. JP2017-090622
Jul. 19, 2017 (JP) .............................. JP2017-139716

(51) Int. Cl.
*H03H 7/46* (2006.01)
*H01P 5/18* (2006.01)
(Continued)

(52) U.S. Cl.
CPC .............. *H03H 7/463* (2013.01); *H01P 5/18* (2013.01); *H01P 7/10* (2013.01); *H03H 7/0161* (2013.01)

(58) Field of Classification Search
CPC ........ H03H 7/463; H03H 7/0161; H01P 5/18; H01P 7/10
See application file for complete search history.

(56) References Cited

U.S. PATENT DOCUMENTS 4,677,402 A 6/1987 Cesani et al.
4,902,992 A * 2/1990 Rubin .................. H01P 1/2135
333/126
(Continued)

FOREIGN PATENT DOCUMENTS

CN 102723543 A 10/2012
CN 103531868 A 1/2014
(Continued)

OTHER PUBLICATIONS

Lee, Boyoung et al., "K-Band Frequency Tunable Substrate-Integrated-Waveguide Resonator Filter with Enhanced Stopband Attenuation", IEEE, Transactions on microwave theory and techniques, Nov. 2015, vol. 63, No. 11, pp. 3632-3640, XP011588890; Cited in EP Search Report dated Nov. 18, 2020. (9 pages).
(Continued)

*Primary Examiner* — Robert J Pascal
(74) *Attorney, Agent, or Firm* — Westerman, Hattori, Daniels & Adrian, LLP

(57) ABSTRACT

A diplexer (100) includes: first and second directional couplers (106A, 106B); and first and second filters (101A, 101B). The filters (101A, 101B) each include a plurality of resonators (110A to 150A, 110B to 150B) that are electromagnetically coupled. The resonators (110A to 150A, 110B to 150B) each have a broad wall that is in a shape of a circle or a regular polygon with six or more vertices, and two resonators, which are coupled together, of the resonators (110A to 150A, 110B to 150B) are arranged such that $D < R_1 + R_2$ is satisfied, where $R_1$ and $R_2$ represent radii of circumcircles of the broad walls of the two resonators and D represents a center-to-center distance between the two resonators.

13 Claims, 17 Drawing Sheets

(51) Int. Cl.
*H01P 7/10* (2006.01)
*H03H 7/01* (2006.01)

(56) References Cited

U.S. PATENT DOCUMENTS

| | | | |
|---|---|---|---|
| 5,894,250 | A | 4/1999 | Ravaska et al. |
| 9,564,672 | B2 | 2/2017 | Burke et al. |

FOREIGN PATENT DOCUMENTS

| | | | |
|---|---|---|---|
| CN | 105048051 | A | 11/2015 |
| CN | 106159387 | A | 11/2016 |
| CN | 106207323 | A | 12/2016 |
| CN | 106450609 | A | 2/2017 |
| FR | 2 346 868 | A1 | 10/1977 |
| JP | H11-239006 | A | 8/1999 |
| JP | 2004-247843 | A | 9/2004 |
| JP | 2014-179935 | A | 9/2014 |
| JP | 6042014 | B1 | 12/2016 |

OTHER PUBLICATIONS

Duong, T. V. et al., "A New Class of Selectivity-improved Mm-waves Dual-mode Substrate Integrated Waveguide Filters", IEEE, pp. 1-3, XP032868394; Cited in EP Search Report dated Nov. 18, 2020. (3 pages).
Potelon, Benjamin et al., "Design of a Substrate Integrated Waveguide(SIW) Filter Using a Novel Topology of Coupling", IEEE, Microwave and Wireless Components Letters, Sep. 2008, vol. 18, No. 9, pp. 596-598, XP011234474; Cited in EP Search Report dated Nov. 18, 2020. (3 pages).
Oncu, Emrah et al., "A Compact Filter using Substrate Integrated Waveguide Technology", IEEE, 2013, p. 527-530, XP032477212; Cited in EP Search Report dated Nov. 18, 2020. (4 pages).
Sirci, Stefano et al., "Substrate Integrated Waveguide Diplexer Based on Circular Triplet Combline Filters", IEEE, Microwave and Wireless Components Letters, vol. 25, No. 7, Jul. 2015, pp. 430-432, XP011662379; Cited in EP Search Report dated Dec. 4, 2020. (3 pages).
Duong, Tuan-Viet et al., "A Millimeter Wave High-Isolation Diplexer Using Selectivity-Improved Dual-Mode Filters", IEEE, Microwave and Wireless Components Letters, vol. 26, No. 2, Feb. 2016, pp. 104-106, XP011598429; Cited in EP Search Report dated Dec. 4, 2020. (3 pages).
Aitken, J. R. et al., "Design of millimetre wave diplexers with relaxed fabrication tolerances", IET Microwaves, Antennas & Propagation, Jan. 1, 2015, vol. 9, iss . 8, pp. 802-807, IET The Institution of Engineering and Technology. (7 pages).
Cheng, Y. L. et al., "A W-band Quadrature Hybrid Coupled Substrate Integrated Waveguide Diplexer", 2015 Asia-Pacific Microwave Conference, Feb. 2016 (3 pages).
International Search Report dated May 22, 2018, issued in counterpart application No. PCT/JP2018/016470 (Form PCT/ISA/210) (3 pages).
International Preliminary Report on Patentability (Forms PCT/IB/338; PCT/IB/373; PCT/ISA/237) for PCT/JP2018/016470 dated Nov. 7, 2019. (18 pages).
Yusuke Uemichi, et. al, "Compact and Low-Loss Bandpass Filter Realized in Silica-Based Post-Wall Waveguide for 60-Ghz applications", Optics and Electronics Laboratory, Fujikura Ltd., Sakura, Chiba, 285-8550, Japan, Graduate School of Advanced Sciences of Matter, Hiroshima University 1-3-1 Kagamiyama, Higashihiroshima 739-8530, Japan (3 pages).
Notification of Transmittal of Translation of the International Preliminary Report on Patentability (Form PCT/ IB/338) of International Application No. PCT/JP2018/016486 dated Nov. 7, 2019 with Forms PCT/IB/373, PCT/ISA/237 (17 pages).
Chongder, Prasun et al., "Design of Dual-Mode Substrate Integrated Hexagonal Cavity (SIHX) Filter for X-Band Application", Microwave Conference Proceedings (APMC), 2013 Asia-Pacific, 2013, pp. 942-944 (4 pages).
Yin, Jun-Xiang et al., "A Triple Cylindrical Cavity W-BAND Filter Implemented in Substrate Integrated Waveguide (SIW)", Microwave, Antenna, Propagation, and EMC Technologies (MAPE), 2015 IEEE 6th International Symposium, 2015, pp. 564-566. (4 pages).
Potelon, Benjamin, et al., "Design of Ku-Band Filter based on Substrate-Integrated Circular Cavities (SICCs)", Microwave Symposium Digest, 2006, IEEE MTT-S International, pp. 1237-1240, (4 pages).
International Search Report dated May 15, 2015, issued in counterpart application No. PCT/JP2018/06486 (3 pages).
Related Co-pending U.S. Appl. No. 16/605,835.
Office Action dated May 5, 2021 issued in co-pending U.S. Appl. No. 16/605,935.

* cited by examiner

DIPLEXER AND MULTIPLEXER

TECHNICAL FIELD

The present invention relates to a diplexer that includes a directional coupler and a resonator-coupled filter. The present invention also relates to a multiplexer that includes a plurality of such diplexers.

BACKGROUND ART

Non-patent Literature 1 discloses in FIG. 8 a diplexer that is designed for use in microwave and millimeter-wave bands.

This diplexer is constituted by two structural units each of which is constituted by: two directional couplers; and two filters that are arranged in parallel to each other so as to reside between the two directional couplers. In the first one of the two structural units, one of the directional couplers is connected to a port 1 illustrated in FIG. 8 of Non-patent Literature 1 and the other of the directional couplers is connected to a port 4 illustrated in FIG. 8 of Non-patent Literature 1. In the second one of the two structural units, one of the directional couplers is connected to a port 2 illustrated in FIG. 8 of Non-patent Literature 1 and the other of the directional couplers is connected to a port 3 illustrated in FIG. 8 of Non-patent Literature 1.

This diplexer is produced by using a post-wall waveguide (PWW) technique. Specifically, this diplexer is produced with use of a substrate made of a dielectric material sandwiched between a pair of conductor layers. The substrate has the foregoing plurality of directional couplers and filters formed therein. Each of these directional couplers and filters is formed by: the pair of conductor layers serving as a pair of broad walls; and a post wall(s), which is/are constituted by a plurality of conductor posts in a palisade arrangement, serving as a narrow wall(s).

The plurality of conductor posts constituting each narrow wall of each of the directional couplers are arranged as illustrated in FIG. 4 of Non-patent Literature 1.

Furthermore, the plurality of conductor posts constituting each narrow wall of each of the filters are arranged as illustrated in FIG. 6 of Non-patent Literature 1. Each of such filters is a three-pole filter consisting of three resonators coupled in series. That is, each of such filters is a resonator-coupled filter.

CITATION LIST

Non-Patent Literature

[Non-patent Literature 1]
Yu-Liang Cheng, Hung-Wei Chen, Peng-Da Huang and Chi-Yang Chang, "A W-band Quadrature Hybrid Coupled Substrate Integrated Waveguide Diplexer", in Proc. Asia-Pacific Microw. Conf., pp. 1-3, December 20015.

SUMMARY OF INVENTION

Technical Problem

One effective method to improve the characteristics (isolation characteristics and reflection characteristics) of such a diplexer is to improve directional characteristics of directional couplers. The inventor of the present invention has found that the widths of a pair of waveguides ($W_{io}$ illustrated in FIG. 4 of Non-patent Literature 1) constituting a directional coupler are important design parameters in improving the directional characteristics. Therefore, a diplexer in which the widths of a pair of waveguides can be easily set to certain values in diplexer design is advantageous for designing a diplexer with good characteristics. In other words, a diplexer in which the design widths of a pair of waveguides can be easily changed offers a high degree of flexibility in designing.

Incidentally, in designing a diplexer, it is preferable that the width of each of a pair of waveguides of a directional coupler ($W_{io}$ illustrated in FIG. 4 of Non-patent Literature 1) is equal to the width of a corresponding waveguide of a filter ($W_{io}$ illustrated in FIG. 6 of Non-patent Literature 1). This is to reduce the return loss at the junction between the directional coupler and the filter and to reduce the return loss of the diplexer. Also in the diplexer illustrated in FIG. 8 of Non-patent Literature 1, the width of each of a pair of waveguides constituting a directional coupler is equal to the width of a corresponding waveguide of a filter.

Therefore, if the width of each of the pair of waveguides constituting the directional coupler is set to a specific value in order to improve the directional characteristics of the directional coupler in such a diplexer, the width of the corresponding waveguide of the filter should also be changed in order to reduce return loss. However, the width of the waveguide of the filter is one of the important design parameters for the filter. Therefore, in order to cause the width of the waveguide of the filter to match the width of the waveguide of the directional coupler, it is necessary to reconsider the appropriate values of the other design parameters for the filter other than the width of the waveguide of the filter.

As has been described, in a conventional diplexer, it has not been easy to change the width of each of a pair of waveguides of a directional coupler in order to improve the characteristics of the diplexer.

The present invention was made in view of the above issues, and an object thereof is to provide a diplexer that includes directional couplers and resonator-coupled filters and that is arranged such that the width of each waveguide of the directional coupler can be easily changed with little or no increase in return loss.

Solution to Problem

In order to attain the above object, a diplexer in accordance with an aspect of the present invention includes: a first directional coupler that is comprised of a first waveguide and a second waveguide; a second directional coupler that is comprised of a third waveguide and a fourth waveguide; a first filter that resides between the first waveguide and the third waveguide; and a second filter that resides between the second waveguide and the fourth waveguide. The first filter and the second filter each include a plurality of resonators that are electromagnetically coupled, the plurality of resonators each have a broad wall that is in a shape of a circle or a regular polygon with six or more vertices, two resonators, which are coupled together, of the plurality of resonators are arranged such that $D<R_1+R_2$ is satisfied, where $R_1$ and $R_2$ represent radii of circumcircles of the broad walls of the two resonators and D represents a center-to-center distance between the two resonators.

A multiplexer in accordance with another aspect of the present invention preferably includes a plurality of the diplexers in accordance with the above aspect.

Advantageous Effects of Invention

A diplexer in accordance with an aspect of the present invention includes directional couplers and resonator-coupled filters, and is arranged such that the width of each of waveguides of the directional couplers can be easily changed with little or no increase in return loss. A multiplexer in accordance with another aspect of the present invention brings about similar effects to those provided by the diplexer in accordance with the above aspect of the present invention.

Figure 5:
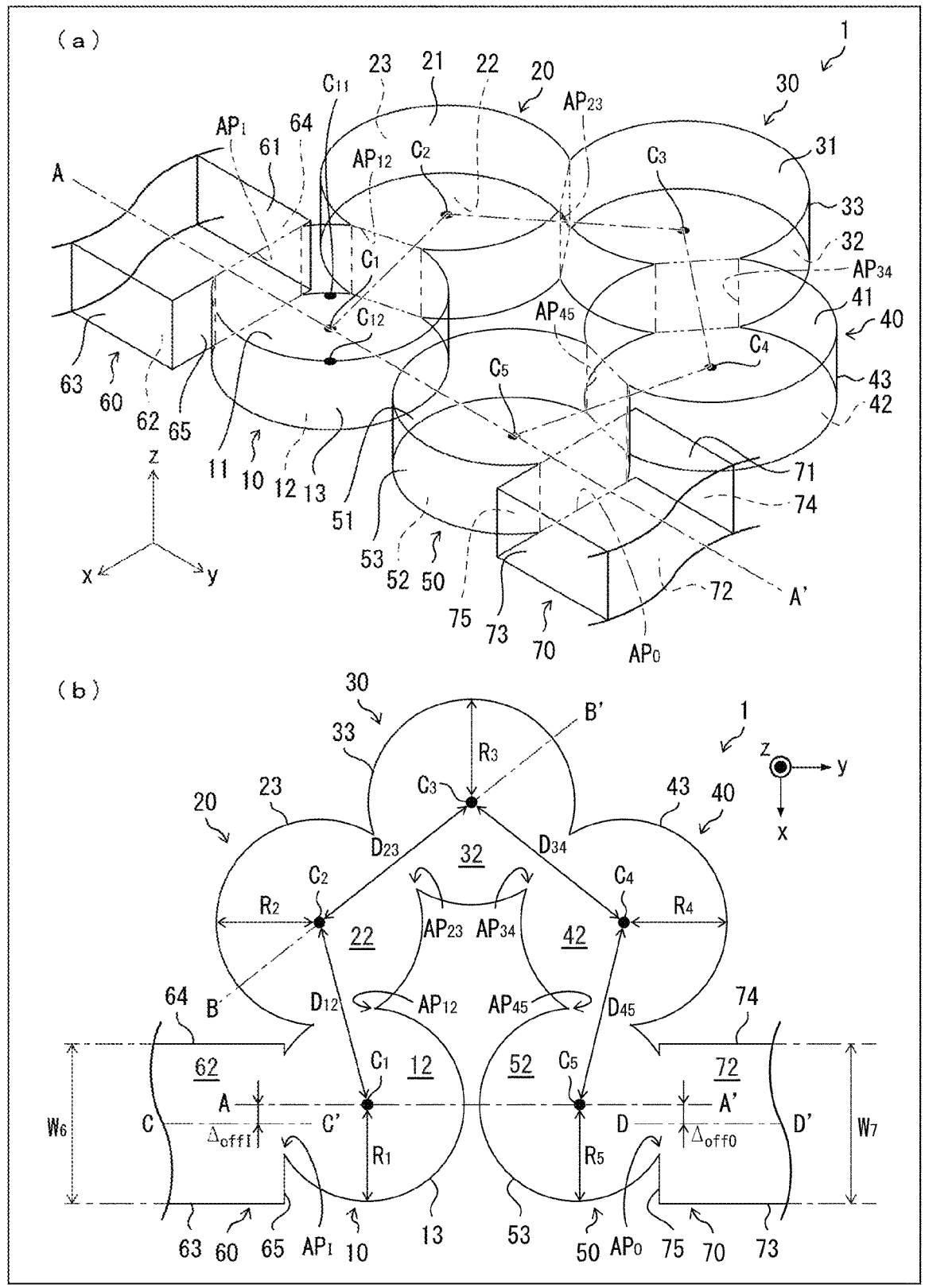

(a) of FIG. 5 is a perspective view illustrating a filter in accordance with Embodiment 3 of the present invention. (b) of FIG. 5 is a plan view of the filter illustrated in (a) of FIG. 5.

Figure 6:
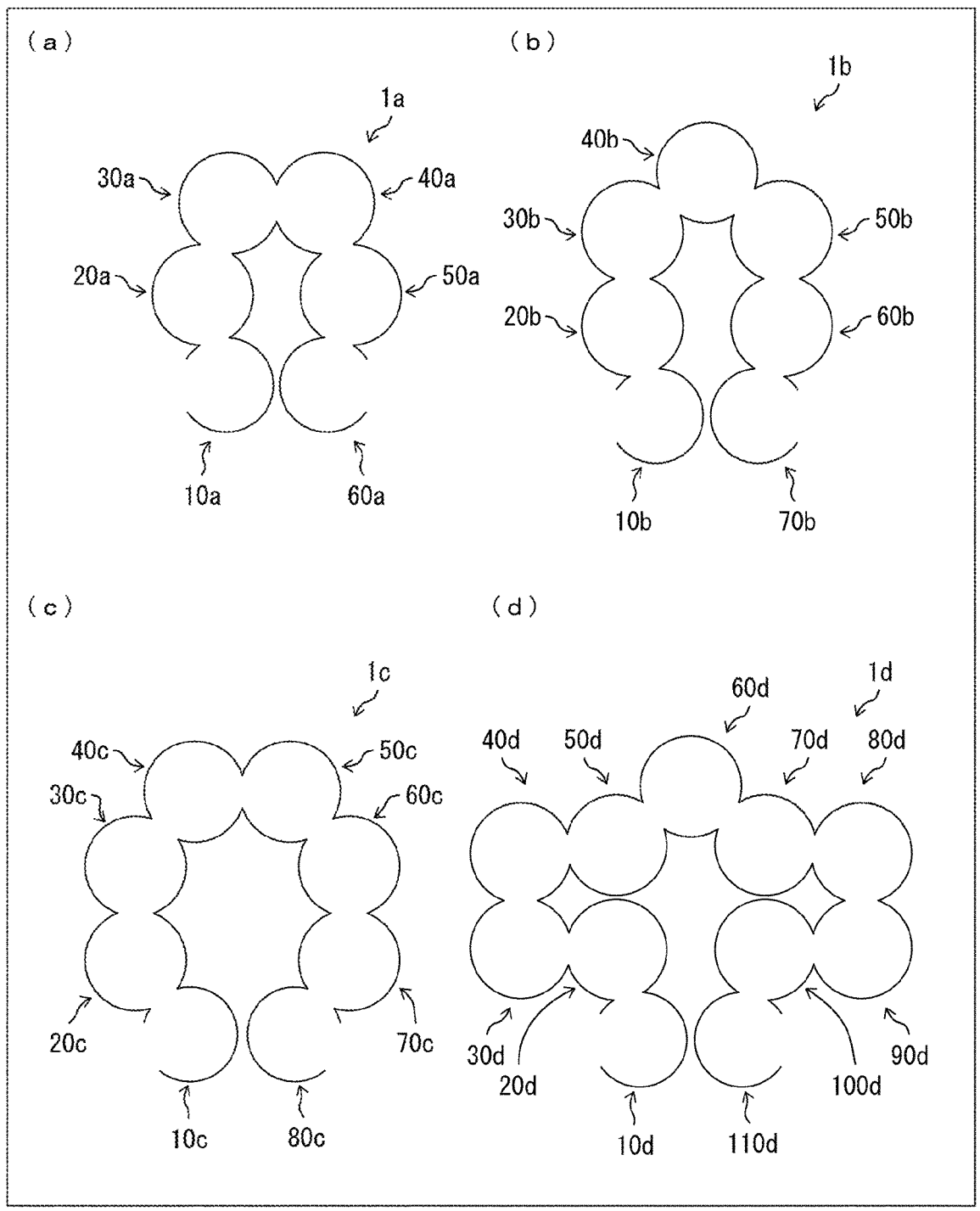

(a) to (d) of FIG. 6 are plan views of respective filters in accordance with Variations 1 to 4 of the present invention.

Figure 7:
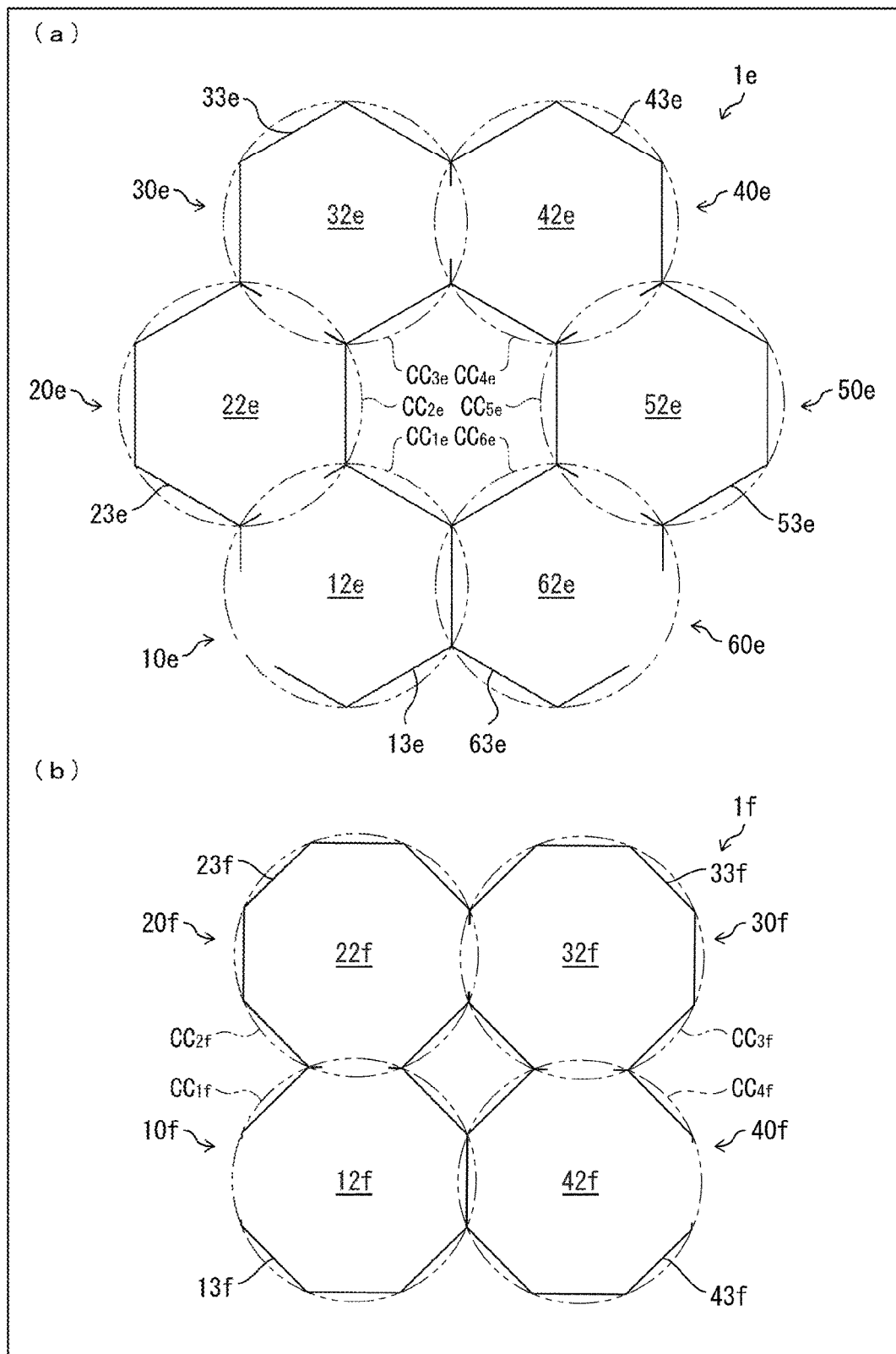

(a) and (b) of FIG. 7 are plan views of respective filters in accordance with Variations 5 and 6 of the present invention.

Figure 8:
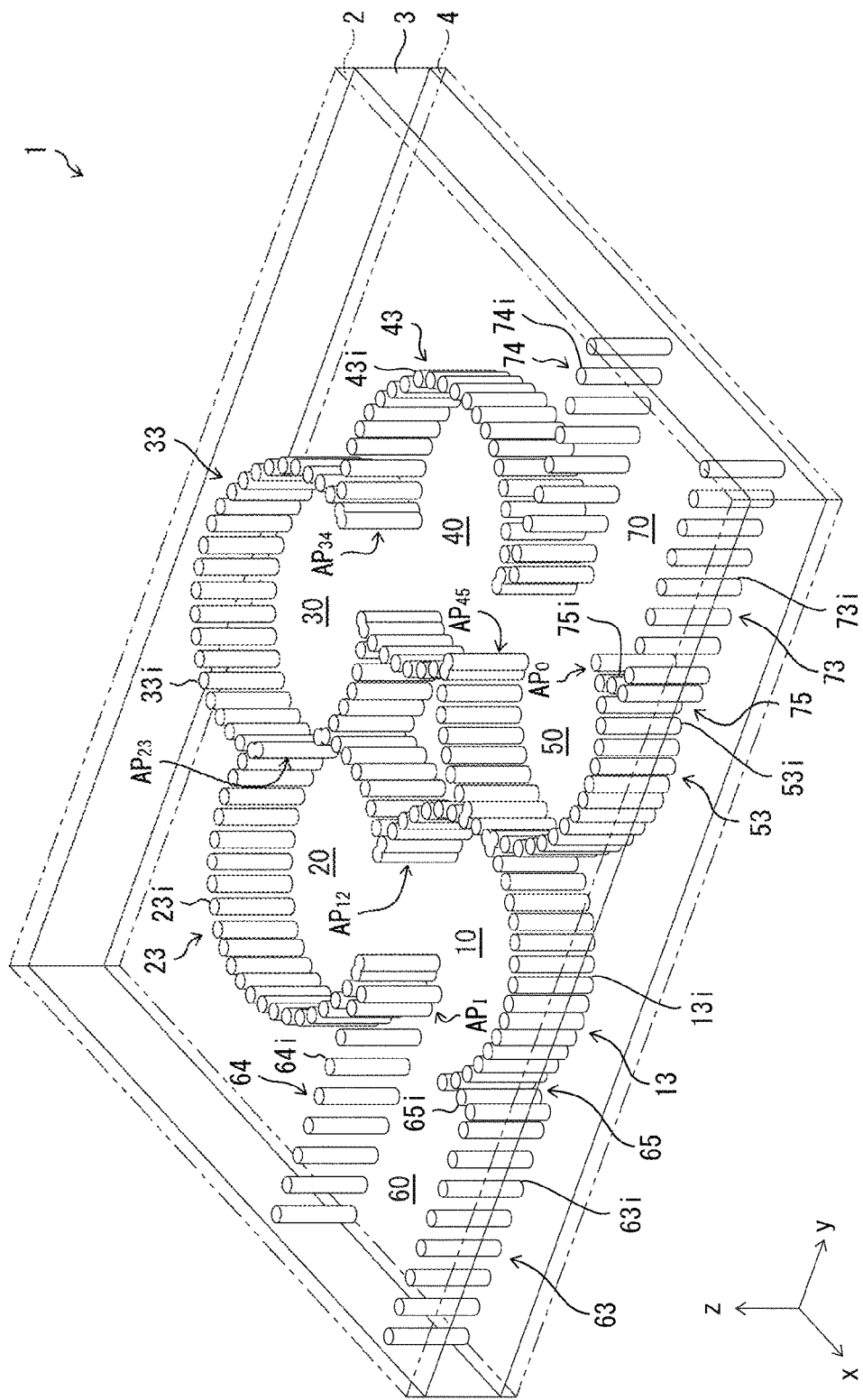

FIG. 8 is a perspective view illustrating an example of a configuration in which the filter illustrated in FIG. 5 is arranged using a post-wall waveguide technique.

Figure 9:
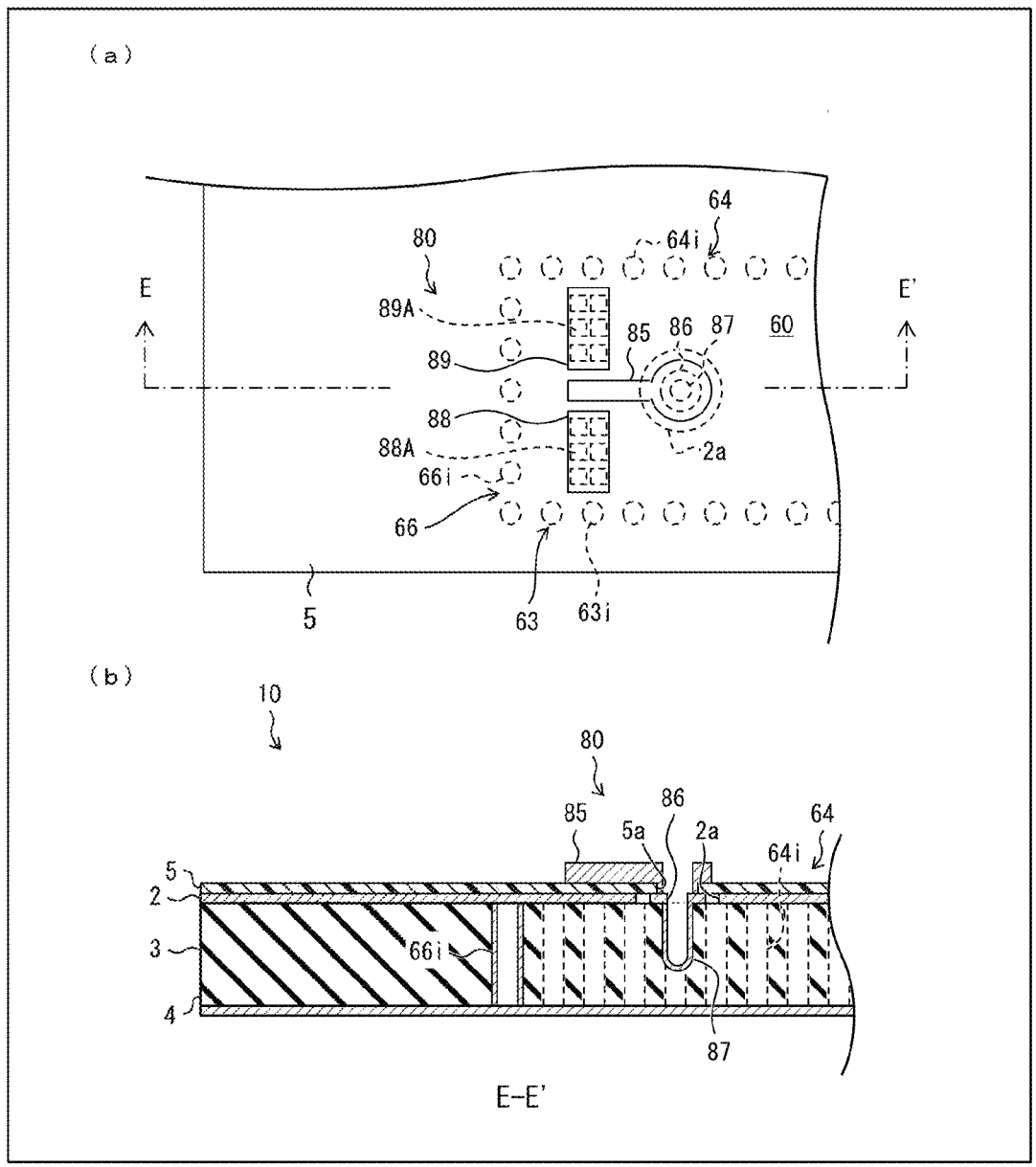

(a) and (b) of FIG. 9 are a plan view and a cross-sectional view of a converter, respectively. The converter is capable of being provided at an end of a waveguide connected to an input port of the filter illustrated in FIG. 8.

Figure 10:
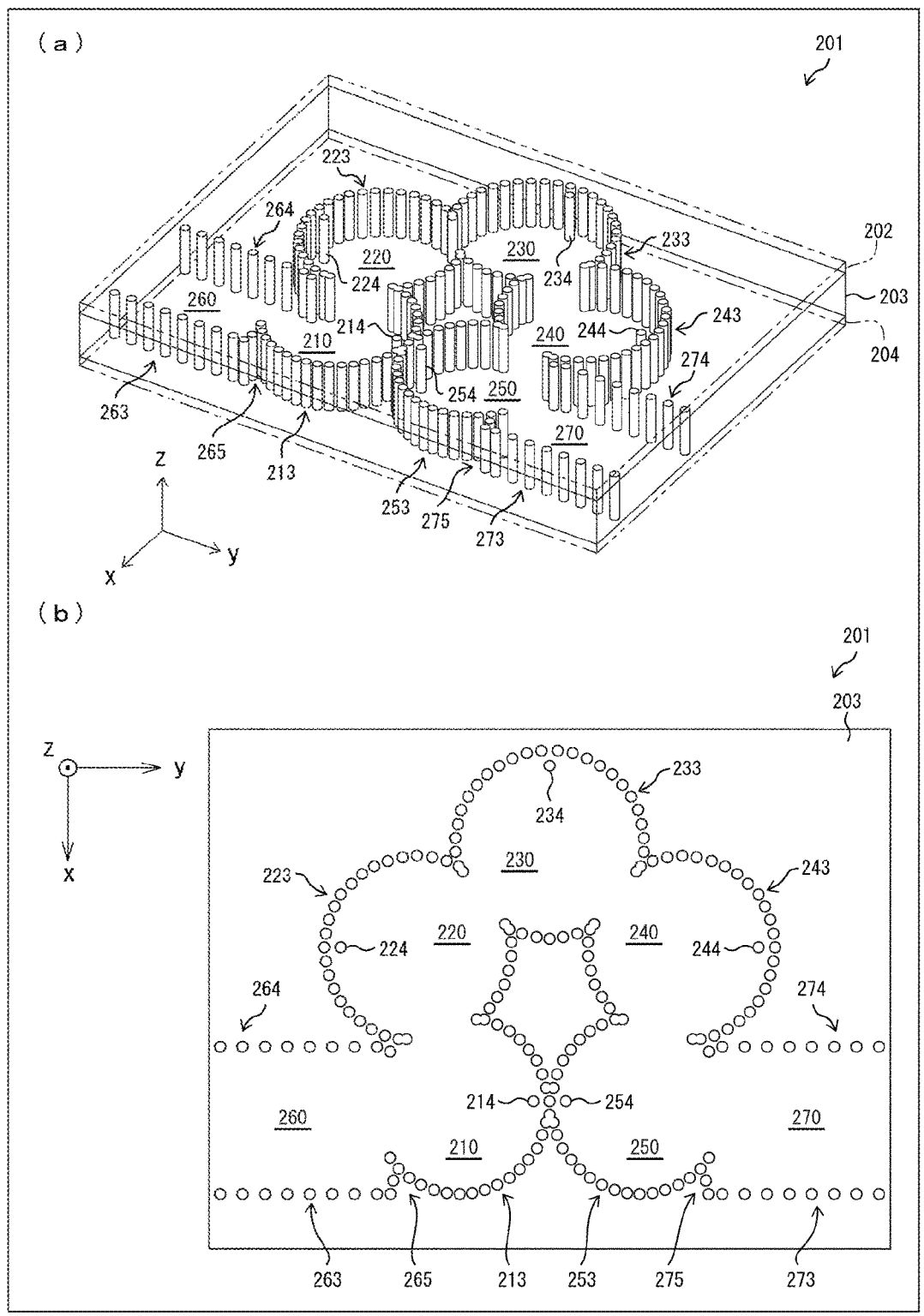

(a) of FIG. 10 is a perspective view illustrating a filter in accordance with Embodiment 4 of the present invention. (b) of FIG. 10 is a plan view of the filter illustrated in (a) of FIG. 10.

Figure 11:
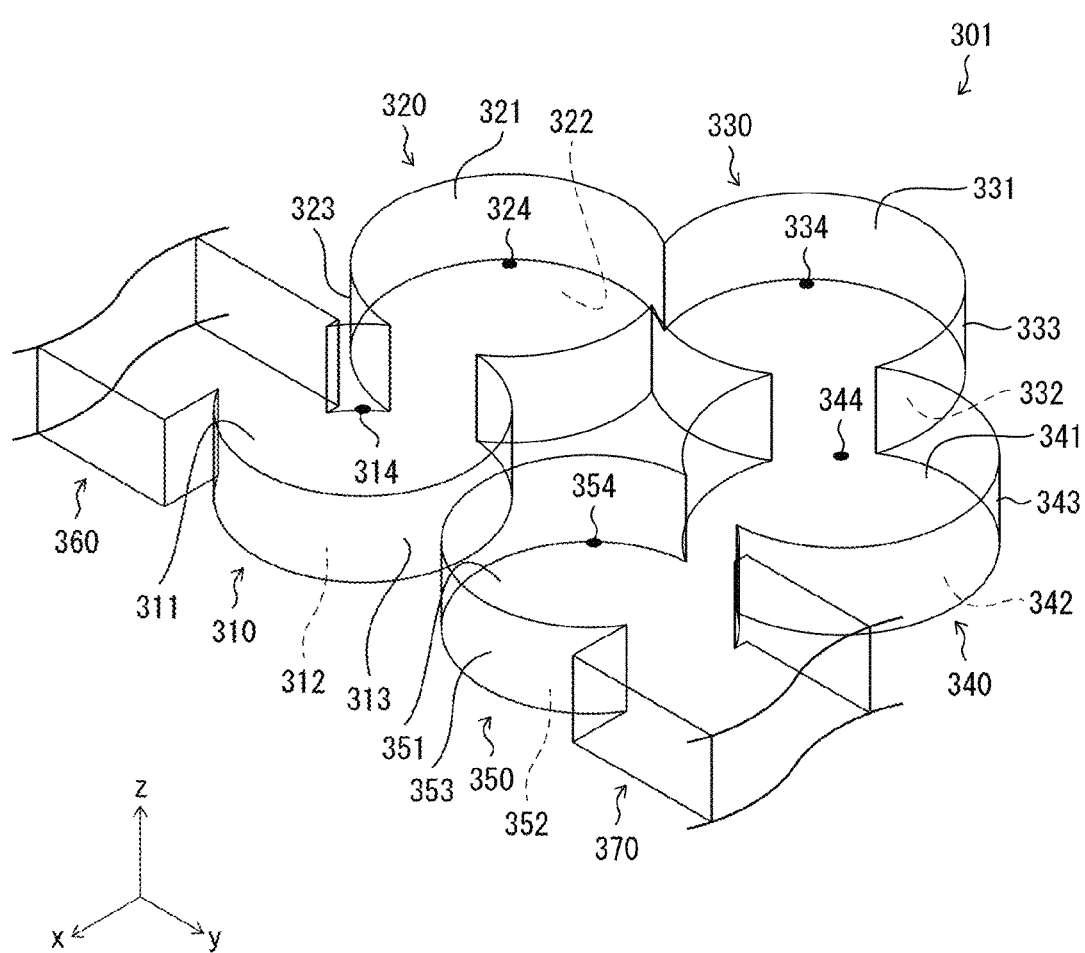

FIG. 11 is a perspective view of a filter which is Variation 7 of the present invention.

Figure 12:
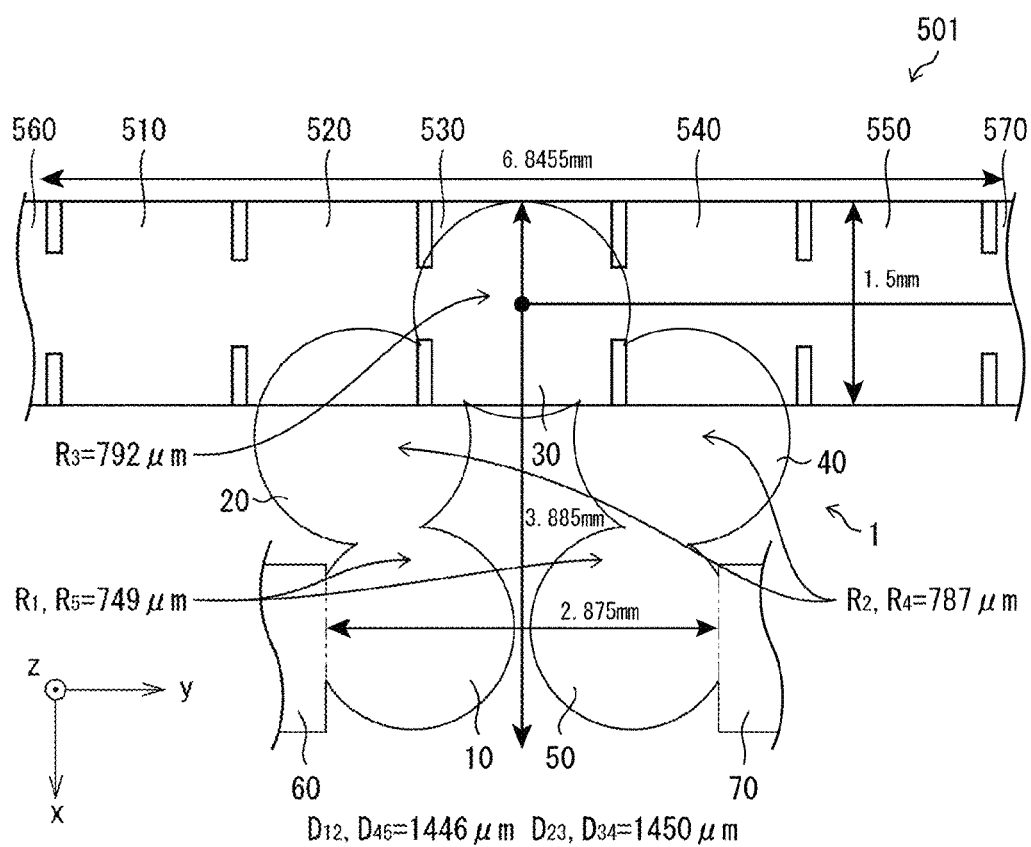

FIG. 12 is a plan view illustrating a filter which is an Example of the present invention and a filter which is a Comparative Example of the present invention.

Figure 13:
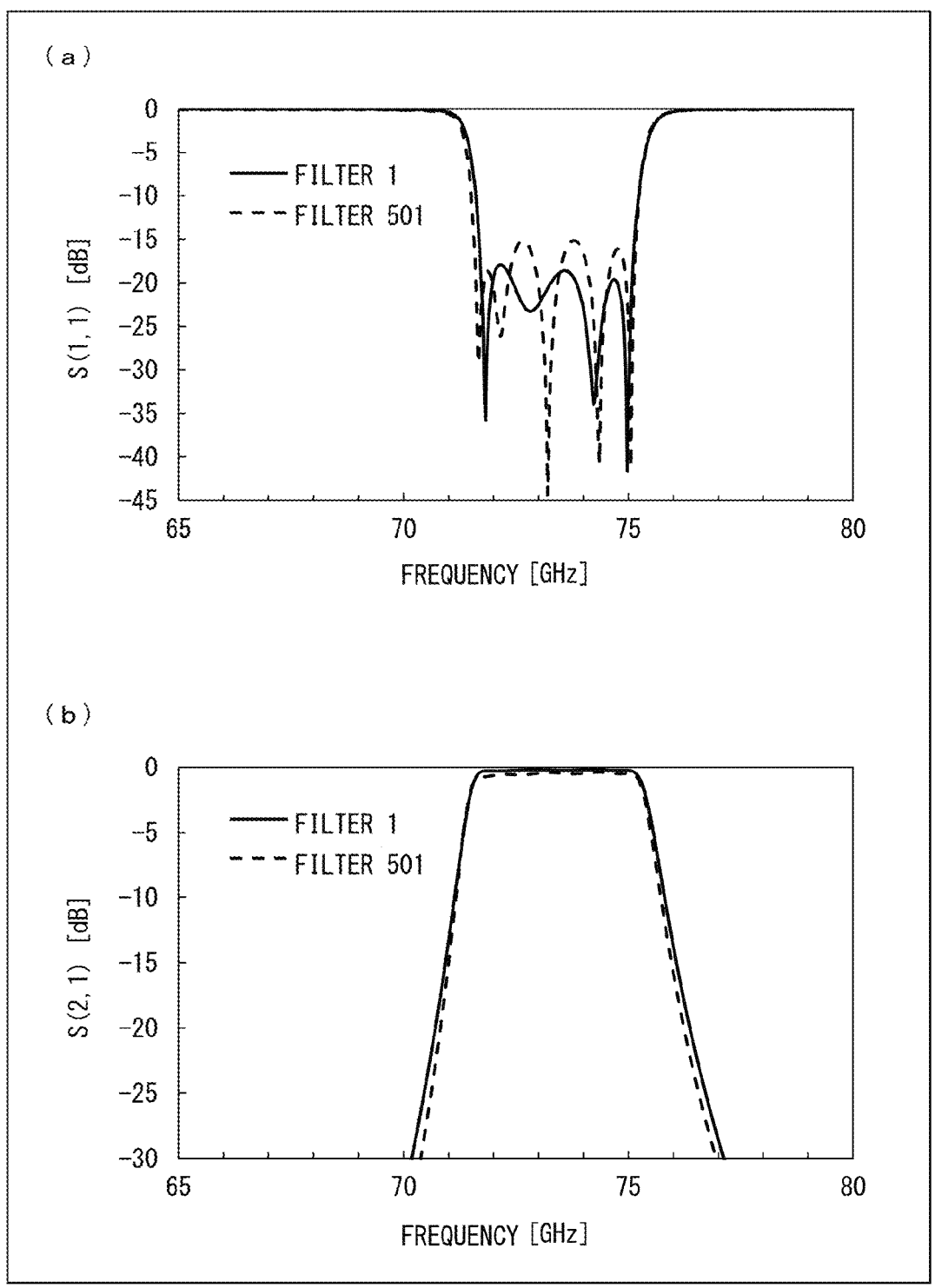

(a) of FIG. 13 is a chart showing reflection characteristics of the filter of the Example and the filter of the Comparative Example illustrated in FIG. 12. (b) of FIG. 13 is a chart showing transmission characteristics of the filter of the Example and the filter of the Comparative Example illustrated in FIG. 12.

Figure 14:
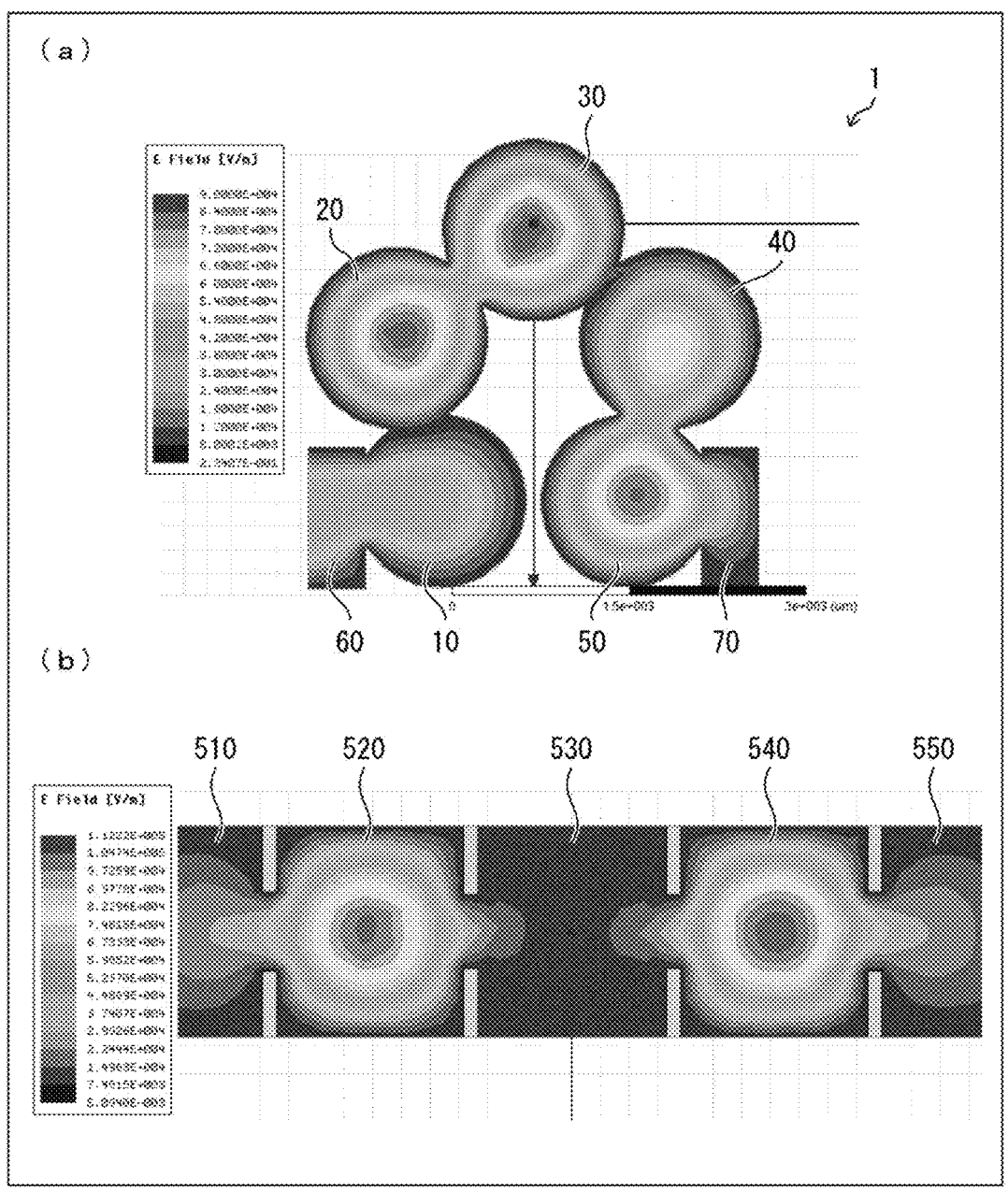

(a) of FIG. 14 is a contour diagram showing an electric field distribution in the filter of the Example illustrated in FIG. 12. (b) of FIG. 14 is a contour diagram showing an electric field distribution in the filter of the Comparative Example illustrated in FIG. 12.

Figure 15:
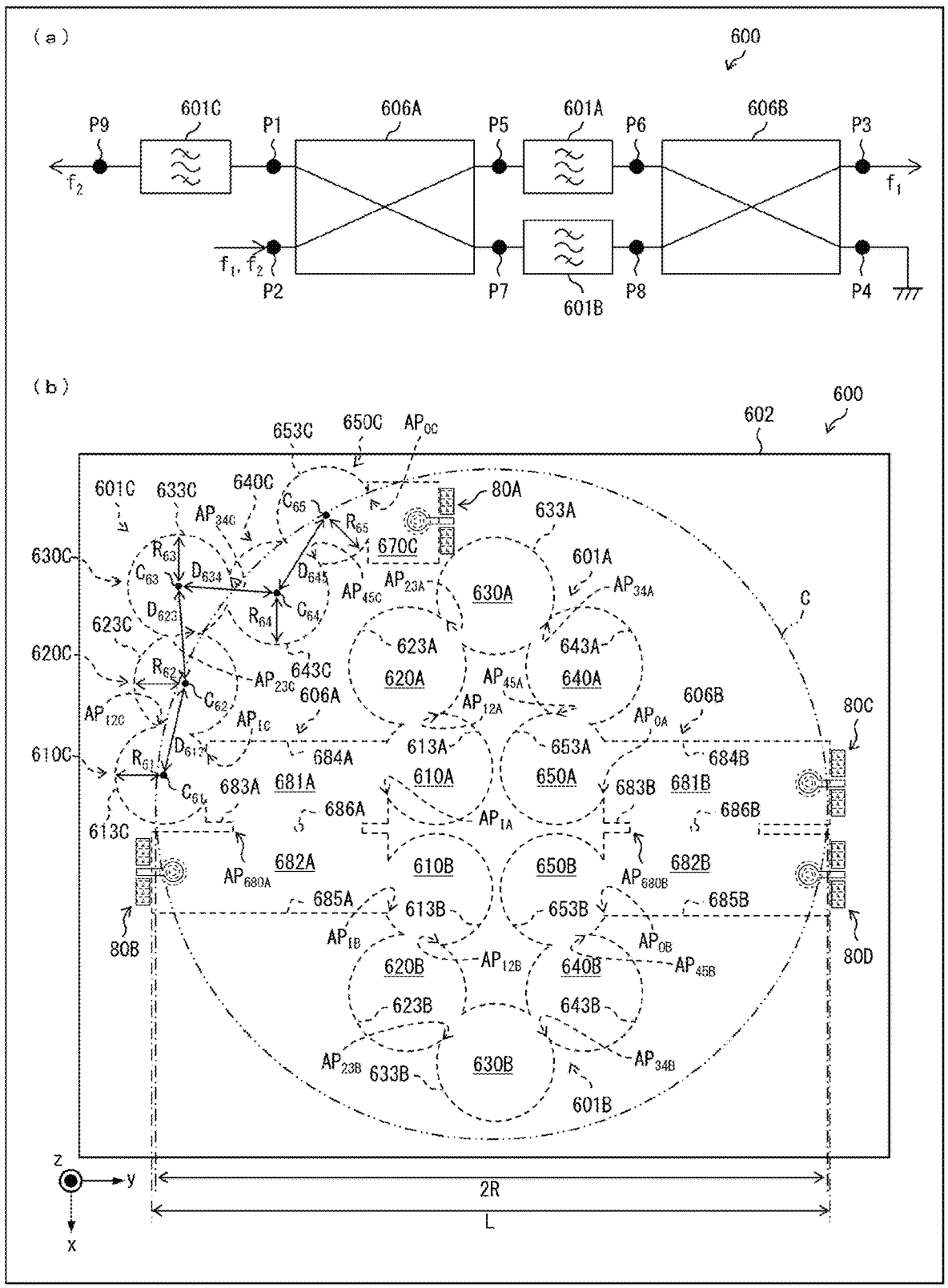

(a) of FIG. 15 is a block diagram illustrating a diplexer in accordance with Embodiment 5 of the present invention. (b) of FIG. 15 is a plan view of the diplexer illustrated in (a) of FIG. 15.

Figure 16:
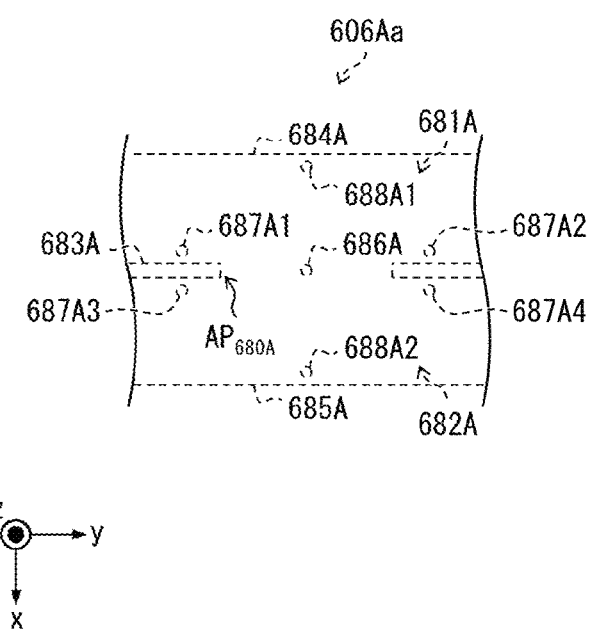

FIG. 16 is a plan view of a variation of a directional coupler included in the diplexer illustrated in FIG. 15.

Figure 17:
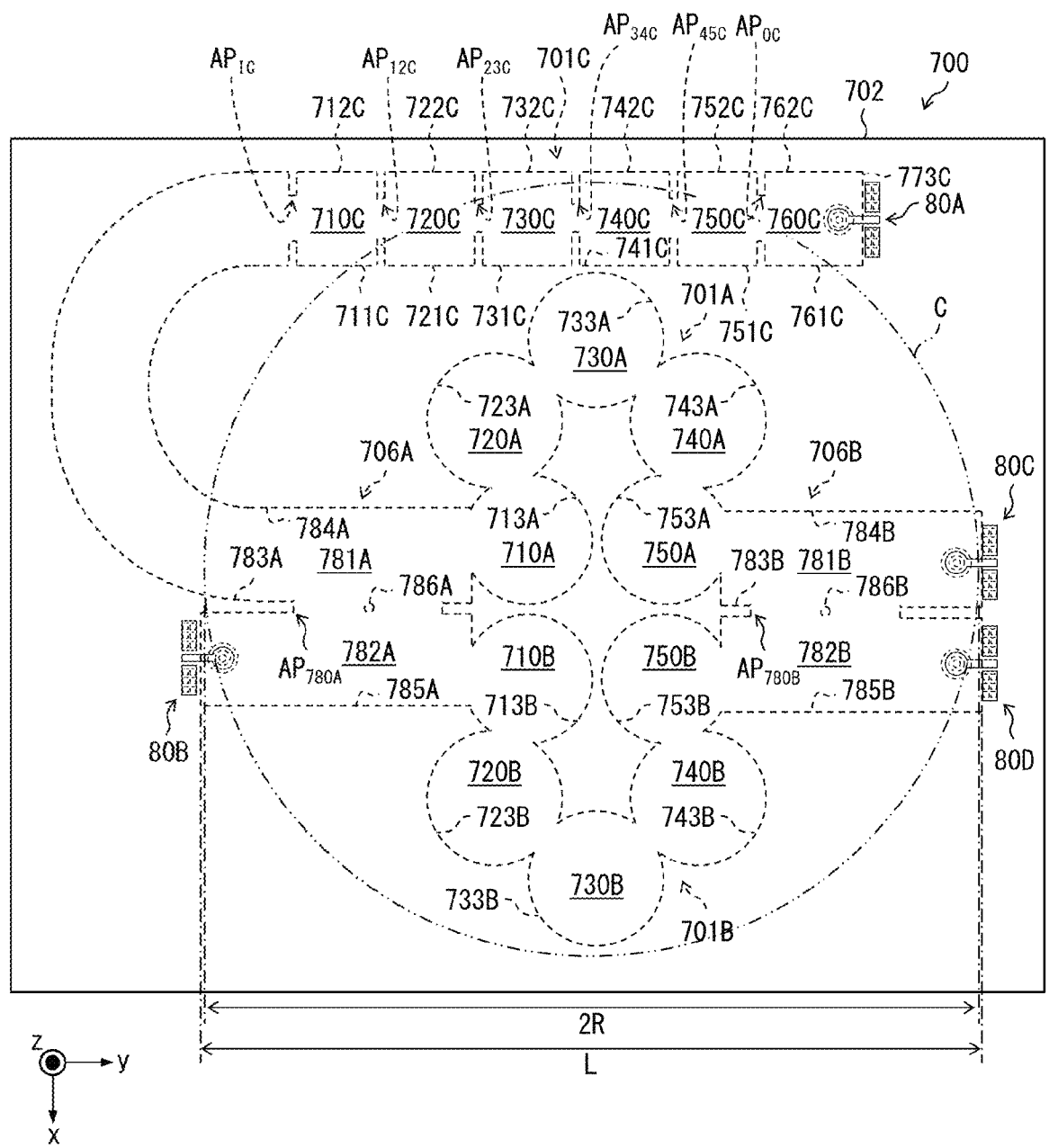

FIG. 17 is a plan view of a diplexer in accordance with Embodiment 6 of the present invention.

Figure 18:
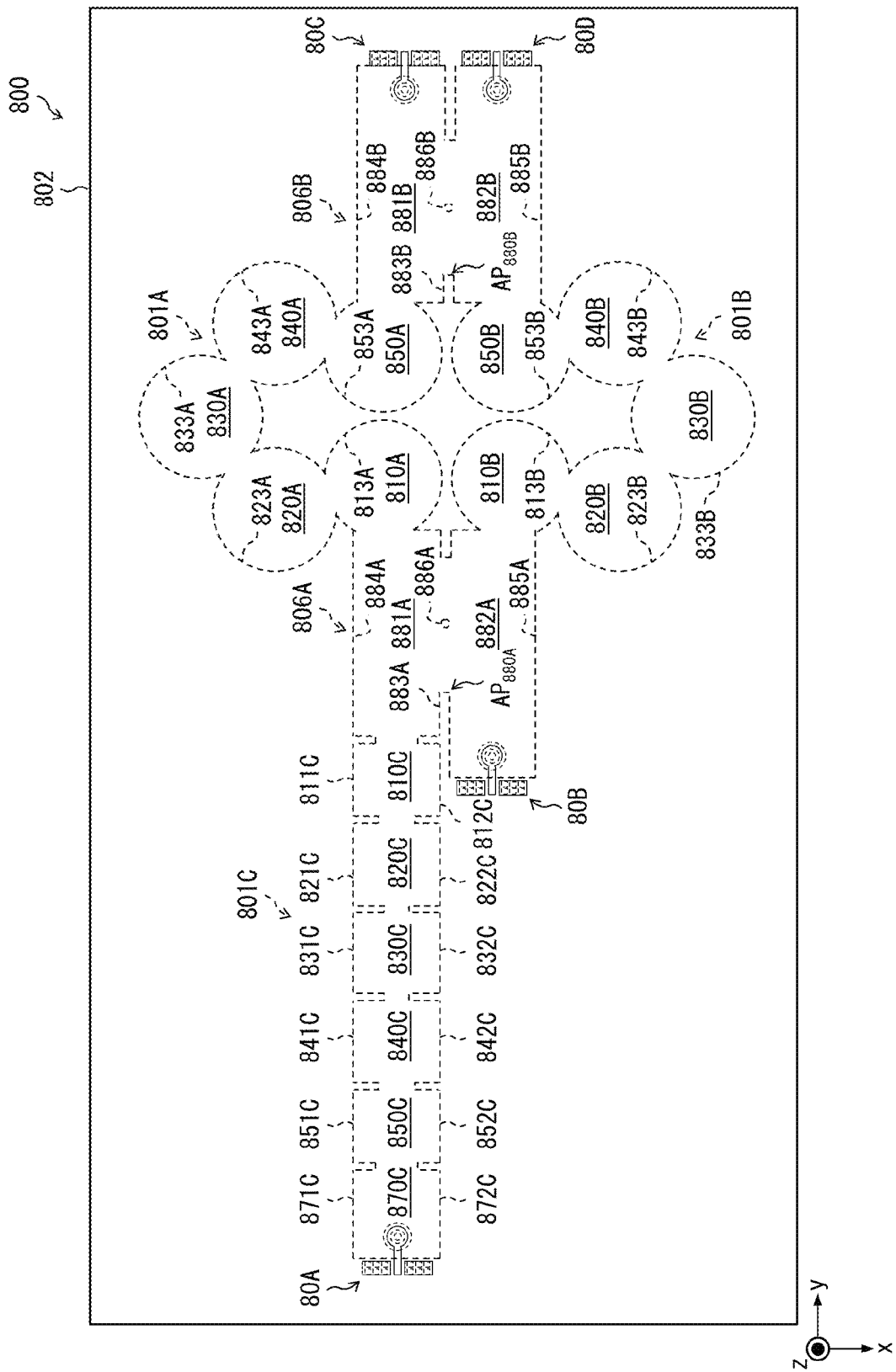

FIG. 18 is a plan view of a diplexer in accordance with Embodiment 7 of the present invention.

DESCRIPTION OF EMBODIMENTS

Embodiment 1

Figure 1:
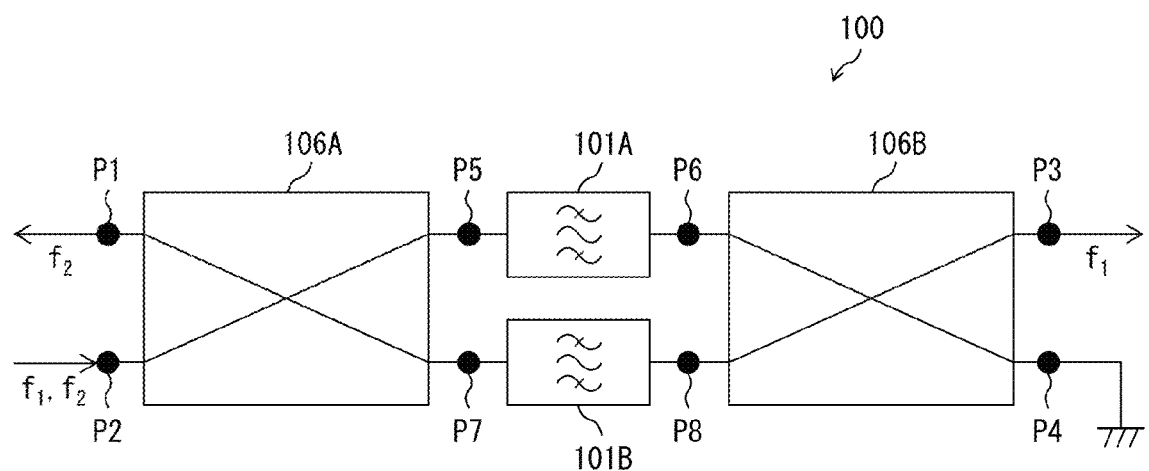
FIG. 1 is a block diagram illustrating a diplexer in accordance with Embodiment 1 of the present invention.
Figure 2:
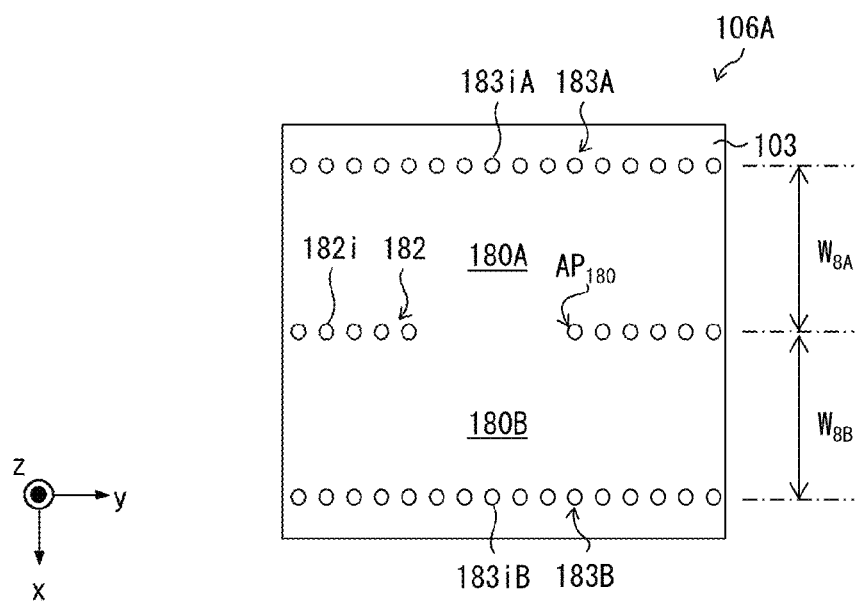
FIG. 2 is a plan view illustrating a directional coupler included in the diplexer illustrated in FIG. 1.
Figure 3:
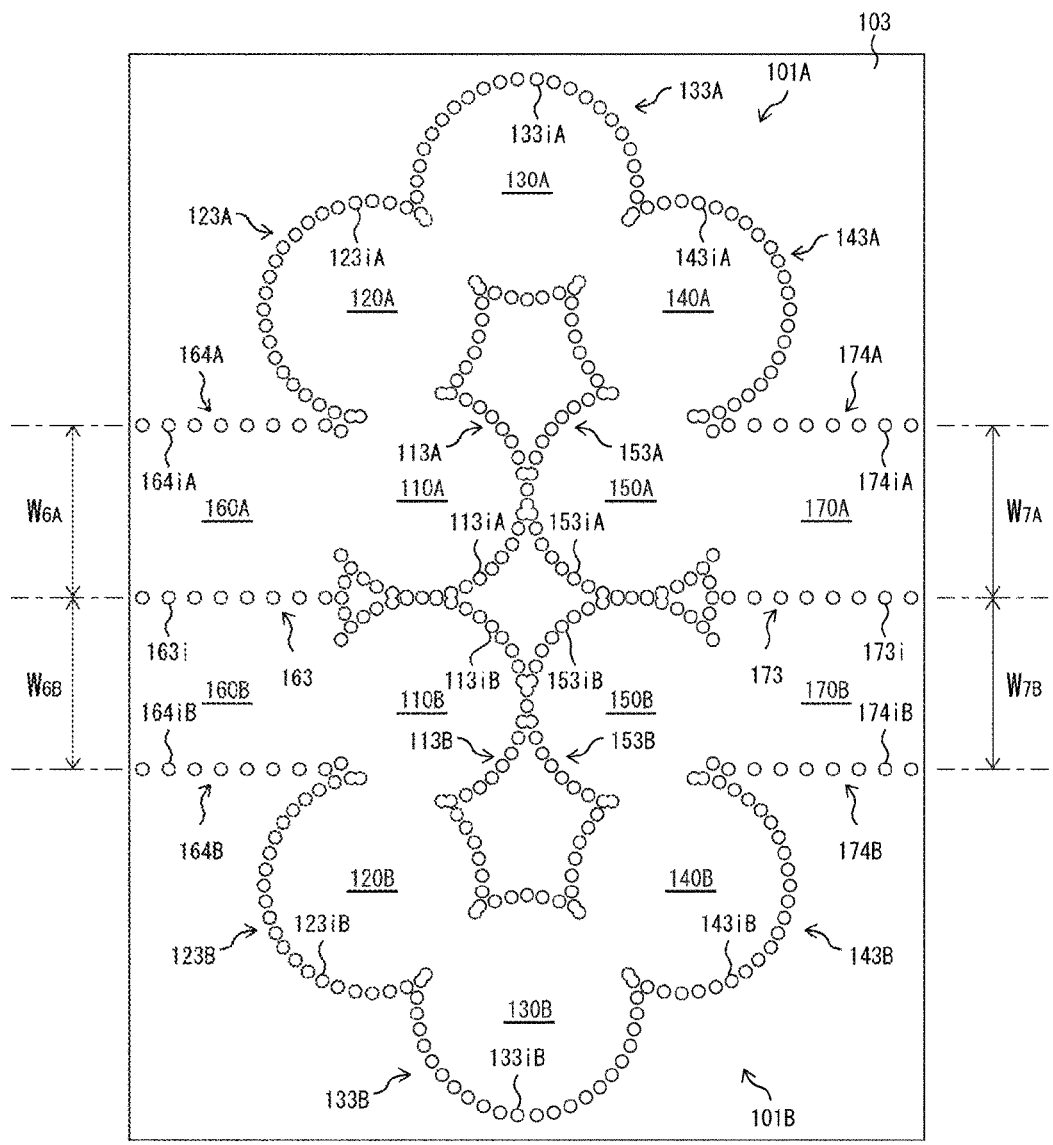
FIG. 3 is a plan view illustrating a filter pair included in the diplexer illustrated in FIG. 1.

The following description will discuss a diplexer in accordance with Embodiment 1 of the present invention with reference to FIGS. 1 to 3. FIG. 1 is a block diagram illustrating a diplexer 100 in accordance with Embodiment 1. FIG. 2 is a plan view illustrating a directional coupler 106A included in the diplexer 100. FIG. 3 is a plan view illustrating a filter pair included in the diplexer 100. FIGS. 2 and 3 each show the diplexer 100 in which one of broad walls forming the directional coupler 106A and the filter pair (i.e., the broad wall positioned downstream in the positive z axis direction) is not illustrated. This is for easy description of an arrangement of narrow walls that form the directional coupler 106A and the filter pair.

<Overview of Diplexer 100>

As illustrated in FIG. 1, the diplexer 100 includes the directional coupler 106A, a directional coupler 106B, a filter 101A, and a filter 101B. The directional coupler 106A, the directional coupler 106B, the filter 101A, and the filter 101B correspond to the first directional coupler, the second directional coupler, the first filter, and the second filter recited in the claims, respectively. The filter 101A and the filter 101B constitute the filter pair that resides between the directional coupler 106A and the directional coupler 106B.

The diplexer 100, i.e., the directional coupler 106A, the directional coupler 106B, the filter 101A, and the filter 101B, can each be produced using a post-wall waveguide technique (described later) (see, for example, FIG. 8), can each be produced using a metallic hollow waveguide tube technique, or can each be produced using a technique of forming a hollow waveguide by machining a metal block. Embodiment 1 is described based on a diplexer 100 that has been produced using a post-wall waveguide technique. Specifically, the directional coupler 106A, the directional coupler 106B, the filter 101A, and the filter 101B, which are integrated with each other, are formed of a substrate made of a dielectric material (substrate 103 illustrated in FIGS. 2 and 3, the dielectric substrate recited in the claims) having conductive layers on opposite surfaces thereof.

The diplexer 100 that employs a post-wall waveguide technique is easy to produce and can be reduced in weight, as compared to a diplexer that employs a metallic waveguide tube technique or a technique of forming a hollow waveguide by machining a metal block.

The directional coupler 106A includes four ports. Two of the four ports constitute a port P1 and a port P2, which are two of four ports of the diplexer 100.

The directional coupler 106B is equal in configuration to the directional coupler 106A. As such, the directional coupler 106B also includes four ports. Two of the four ports constitute a port P3 and a port P4, which are the other two of the four ports of the diplexer 100.

The filter 101A is a resonator-coupled band-pass filter that is comprised of a plurality of resonators electromagnetically coupled. In this specification, the term "filter" refers to a band-pass filter, unless otherwise noted. The filter 101A is configured to allow passage of electromagnetic waves having a frequency within a band $f_1$ that is a desired band, and to reflect electromagnetic waves having a frequency outside the band $f_1$.

The filter 101A includes the following two ports: a port P5 and a port P6. The port P5 is connected to one of the four ports of the directional coupler 106A other than the ports P1 and P2. The port P6 is connected to one of the four ports of the directional coupler 106B other than the ports P3 and P4.

The filter 101B is equal in configuration to the filter 101A. Specifically, the filter 101B is designed based on equal design parameters to those of the filter 101A, and is configured to allow passage of electromagnetic waves having a frequency within the band $f_1$ and to reflect electromagnetic waves having a frequency outside the band $f_1$.

The filter 101B also includes the following two ports: a port P7 and a port P8. The port P7 is connected to one of the four ports of the directional coupler 106A other than the ports P1 and P2 and the port connected to the port P5 of the filter 101A. The port P8 is connected to one of the four ports of the directional coupler 106B other than the ports P3 and P4 and the port connected to the port P6 of the filter 101A.

The filters 101A and 101B are arranged to run along each other, as illustrated in FIG. 1.

To the port P2 of the diplexer 100 arranged like above, a high frequency signal is coupled (see FIG. 1). The high frequency signal is a superimposed signal composed of a first high frequency signal and a second high frequency signal. The first high frequency signal is a modulated version of an electromagnetic wave having a frequency within the band $f_1$, whereas the second high frequency signal is a modulated version of an electromagnetic wave having a frequency within a band $f_2$ that is different from the band $f_1$. In this case, the first high frequency signal, after passing through the filters 101A and 101B, is outputted through the port P3. On the contrary, the second high frequency signal, after reflected by the filters 101A and 101B, is outputted through the port P1.

As such, the diplexer 100 is capable of separating the high frequency signal, which is a superimposed signal composed of the first frequency signal and the second high frequency signal, into the first frequency signal and the second high frequency signal.

Note that, in order that the reflection at the port P4 will be reduced to the greatest possible extent, the port P4 is preferably terminated as illustrated in FIG. 1.

<Directional Couplers 106A and 106B>

As described earlier, the directional couplers 106A and 106B are equal in configuration to each other. In view of this, the following description is based on the directional coupler 106A.

As illustrated in FIG. 2, the directional coupler 106A includes the following pair of waveguides: a waveguide 180A and a waveguide 180B. The waveguide 180A and the waveguide 180B are each a rectangular waveguide whose cross section is rectangle and whose four faces are constituted by a pair of broad walls and a pair of narrow walls.

The waveguide 180A and the waveguide 180B, which employ a post-wall waveguide technique, are formed of a substrate 103 made of a dielectric material having conductor layers on respective opposite surfaces thereof. Both the conductor layer on one surface of the substrate 103 and the conductor layer on the other surface of the substrate 103, that is, both a pair of conductor layers, are not illustrated in FIG. 2.

The pair of conductor layers functions as a pair of broad walls that form the waveguide 180A and the waveguide 180B. The substrate 103 has therein a plurality of through-holes that pass through the substrate 103 from one surface of the substrate 103 to the other surface of the substrate 103. The through-holes each have a conductor film on the inner wall thereof such that the pair of conductor layers are in electrical communication with each other. That is, each of the through-holes has a conductor post therein via which the pair of conductor layers are in electrical communication with each other.

A post wall, which is constituted by a plurality of conductor posts arranged at certain intervals in a palisade arrangement, functions as a kind of conducting wall that reflects electromagnetic waves within a band that depends on the certain intervals. The pair of narrow walls forming the waveguide 180A, that is, a narrow wall 182 and a narrow wall 183A, are such post walls. The narrow wall 182 is constituted by conductor posts 182$i$ arranged in a straight line, whereas the narrow wall 183A is constituted by conductor posts 183$i$A arranged in a straight line. The narrow wall 182, which is one of the pair of narrow walls forming the waveguide 180B, is shared by the waveguide 180B and the waveguide 180A. The narrow wall 183B, which is the other of the pair of narrow walls forming the waveguide 180B, is similar in configuration to the narrow wall 183A. That is, the narrow wall 183B is constituted by conductor posts 183$i$B arranged in a straight line.

Note that the narrow wall 182, the narrow wall 183A, and the narrow wall 183B are in parallel to one another (in Embodiment 1, parallel). Therefore, a width $W_{8A}$ of the waveguide 180A and a width $W_{8B}$ of the waveguide 180B are uniform throughout the waveguides 180A and 180B.

A waveguide aperture $AP_{180}$, through which the waveguide 180A and the waveguide 180B are electromagnetically coupled together, is formed by missing one(s) of the conductor posts 182$i$ that constitute the narrow wall 182.

<Filter 101A, Filter 101B>

The filter 101A and the filter 101B are equal in configuration to each other. Furthermore, the filter 101A and the filter 101B are each equal in configuration to a filter 1 that will be described later in Embodiment 3, more specifically, a filter 1 that will be described later with reference to FIG. 8.

In view of above, the filters 101A and 101B are not described in detail in Embodiment 1. Note that the reference numbers assigned to respective members of each of the filters 101A and 101B are obtained by changing those of respective corresponding members of the filter 1 such that each of the reference numbers is in the 100$s$ and has the suffix "A" or "B" at the end thereof.

In the diplexer 100, the filter 101A and the filter 101B are each arranged such that a waveguide 160A and a waveguide 160B are in contact with each other and run along each other (in Embodiment 1, parallel to each other) and that waveguides 170A and 170B are in contact with each other and run along each other (in Embodiment 1, parallel to each other), as illustrated in FIG. 3. Note that, in Embodiment 1, a narrow wall 163, which is one of a pair of narrow walls, is shared by the waveguide 160A and the waveguide 160B, whereas a narrow wall 173, which is one of a pair of narrow falls, is shared by the waveguide 170A and the waveguide 170B. The filter pair constituted by the filters 101A and 101B thus arranged is symmetric with respect to the centerline of the narrow walls 163 and 173 (i.e., with respect to a straight line passing through the centers of conductor posts 163$i$ and the centers of conductor posts 173$i$).

Note that the narrow wall 163, a narrow wall 164A, and a narrow wall 164B are in parallel to one another (in Embodiment 1, parallel), whereas the narrow wall 173, a narrow wall 174A, and a narrow wall 174B are in parallel to one another (in Embodiment 1, parallel). Therefore, a width $W_{6A}$ of the waveguide 160A and a width $W_{6B}$ of the waveguide 160B are uniform throughout the waveguides 160A and 160B, whereas a width $W_{7A}$ of the waveguide 170A and a width $W_{7B}$ of the waveguide 170B are uniform throughout the waveguides 170A and 170B.

<Effect Brought about by Diplexer 100>

In the filter 101A, the waveguide 160A is coupled to a resonator 110A whose broad walls are in the shape of a circle, and the waveguide 170A is coupled to a resonator 150A whose broad walls are in the shape of a circle. Similarly, in the filter 101B, the waveguide 160B is coupled to a resonator 110B whose broad walls are in the shape of a circle, and the waveguide 170B is coupled to a resonator 150B whose broad walls are in the shape of a circle.

As such, a junction between the resonator 110A and the waveguide 160A, a junction between the resonator 150A and the waveguide 170A, a junction between the resonator 110B and the waveguide 160B, and a junction between the resonator 150B and the waveguide 170B each have a structural discontinuity due to mismatch between the shape of each waveguide and the shape of its corresponding resonator. In each of such junctions, return loss would increase because of the structural discontinuity; however, in the filter 101A, such an increase in return loss can be reduced by adjusting (optimizing) offsets $\Delta_{offI}$ and $\Delta_{offO}$ each of which is the distance between (i) a straight line that passes through the center of the resonator 110A and the center of the resonator 150A (this line corresponds to straight line AA' illustrated in FIG. 5) and (ii) the central axis of each waveguide (the central axis corresponds to straight line CC' or straight line DD' illustrated in FIG. 5).

Therefore, even in cases where the width $W_{6A}$ of the waveguide 160A and the width $W_{7A}$ of the waveguide 170A of the filter 101A are set to certain widths, an increase in return loss described above can be reduced by adjusting the offsets $\Delta_{off}$. The same applies to the filter 101B. In addition, the fact that the width $W_{6A}$ and the width $W_{7A}$ can be set to any widths means that the width $W_{8A}$ of the waveguide 180A and the width $W_{8B}$ of the waveguide 180B of the directional coupler 106A can be set to any widths.

As such, the diplexer 100 makes it possible to provide a diplexer in which the width of each of waveguides of each directional coupler can be easily changed with little or no increase in return loss at a junction between the waveguide and a corresponding filter (more specifically, a first-pole resonator of the filter or a last-pole resonator of the filter).

The inventor of the present invention has found that the width $W_{8A}$ and the width $W_{8B}$ can be suitably used as design parameters for improving the directional characteristics of the directional coupler 106A. If it is possible to improve the directional characteristics of the directional coupler 106A, then it will be possible to improve the characteristics (mainly, isolation characteristics and reflection characteristics) of the diplexer 100 as a whole. That is, by optimizing the width $W_{8A}$ and the width $W_{8B}$ which are design parameters, it is possible to achieve desired directional characteristics of the directional coupler 106A and, in turn, improve the characteristics of the diplexer 100.

However, in a diplexer (for example, the diplexer disclosed in Non-patent Literature 1) which includes filters each comprised of rectangular resonators arranged in a straight line, if the widths of a pair of waveguides of a directional coupler are set to certain values, in order to cause the widths of waveguides of such filters to match the widths of the pair of waveguides of the directional coupler, it is necessary to reconsider the appropriate values of the other design parameters other than the widths of the waveguides of the filters.

In contrast, in cases of the diplexer 100, it is possible to easily change the width of each of the waveguides of each directional coupler with little or no increase in return loss at the junctions, as described earlier. This makes it possible to increase the degree of flexibility in design.

Embodiment 2

Figure 4:
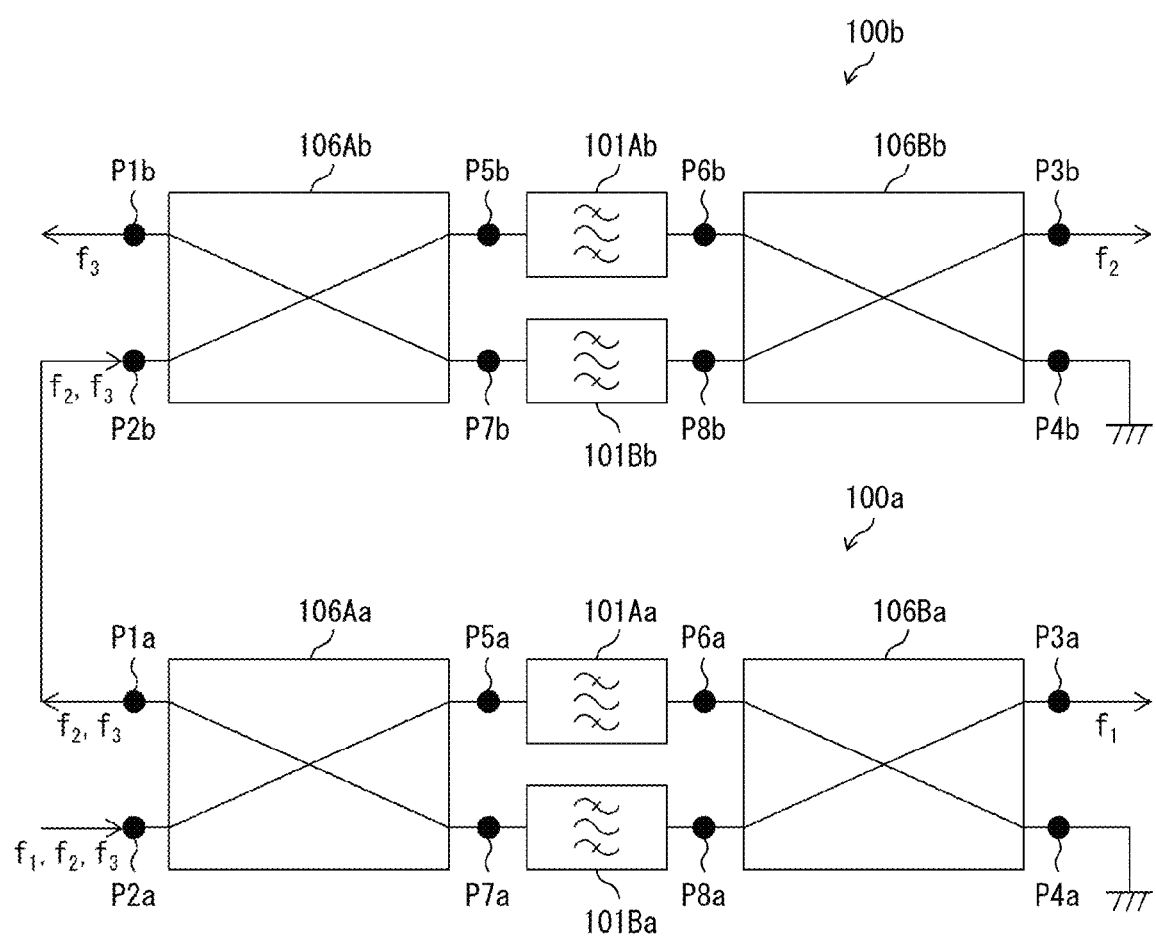
FIG. 4 is a block diagram of a multiplexer in accordance with Embodiment 2 of the present invention.

The following description will discuss a multiplexer in accordance with Embodiment 2 of the present invention with reference to FIG. 4. FIG. 4 is a block diagram of the multiplexer in accordance with Embodiment 2.

As illustrated in FIG. 4, the multiplexer in accordance with Embodiment 2 includes two of the diplexers 100 in accordance with Embodiment 1. In Embodiment 2, the reference numbers for the two diplexers 100 are assigned the suffixes "a" and "b" for distinction between the two diplexers 100. Specifically, one of the two diplexers 100 is referred to as a diplexer 100a, whereas the other of the two diplexers 100 is referred to as a diplexer 100b. Furthermore, the reference numbers assigned to the respective members of each of the diplexers 100a and 100b are also assigned the suffix "a" or "b".

Filters 101Aa and 101Ba included in the diplexer 100a are configured to allow passage of electromagnetic waves having a frequency within the band $f_1$ and to reflect electromagnetic waves having a frequency outside the band $f_1$. In contrast, filters 101Ab and 101Bb included in the diplexer 100b are configured to allow passage of electromagnetic waves having a frequency within a band $f_2$ that is different from the band $f_1$ and to reflect electromagnetic waves having a frequency outside the band $f_2$.

The diplexer 100a is equal in configuration to the diplexer 100 in accordance with Embodiment 1. The diplexer 100b is equal in configuration to the diplexer 100 in accordance with Embodiment 1 except that the passband is the band $f_2$. Therefore, in Embodiment 2, the diplexers 100a and 100b are not described in detail, and only the manner in which the diplexer 100a and the diplexer 100b are connected to each other and the functions of the multiplexer are described.

As illustrated in FIG. 4, a port P1a of the diplexer 100a is connected to a port P2b of the diplexer 100b. The diplexers 100a and 100b are integrated with the use of a single substrate made of a dielectric material; therefore, a waveguide that connects the port P1a and the port P2B is preferably also provided in the same substrate.

To a port P2a of the diplexer 100a of the multiplexer arranged as described above, a high frequency signal is coupled. The high frequency signal is a superimposed signal composed of a first high frequency signal, a second high frequency signal, and a third high frequency signal. The first high frequency signal is a modulated version of an electromagnetic wave having a frequency within the band $f_1$, the second high frequency signal is a modulated version of an electromagnetic wave having a frequency within the band $f_2$ that is different from the band $f_1$, and the third high frequency signal is a modulated version of an electromagnetic wave having a frequency within a band $f_3$ that is different from the band $f_1$ and the band $f_2$. In this case, the first high frequency signal, after passing through the filters 101Aa and 101Ba, is outputted through a port P3a. On the contrary, the second high frequency signal and the third high frequency signal, after reflected by the filters 101Aa and 101Ba, are outputted through the port P1a.

The second high frequency signal and the third high frequency signal, after outputted through the port P1a, are coupled to the port P2b of the diplexer 100b. It follows that the second high frequency signal, after passing through the filters 101Ab and 101Bb, is outputted through a port P3b. On the contrary, the third high frequency signal, after reflected at the filters 101Ab and 101Bb, is outputted through a port P1b.

As such, the multiplexer including the diplexers 100a and 100b is capable of separating the high frequency signal, which is a superimposed signal composed of the first frequency signal, the second high frequency signal, and the third high frequency signal, into the first frequency signal, the second high frequency signal, and the third high frequency signal.

Note that the number of diplexers included in the multiplexer in accordance with Embodiment 2 is not limited to two, and may be any number selected from integers n. A multiplexer that is comprised of n diplexers is capable of separating a high frequency signal which is a superimposed signal composed of n+1 high frequency signals (the first to (n+1)-th high frequency signals) that belong to respective different bands into the first to (n+1)-th high frequency signals.

The multiplexer arranged like above brings about similar effects to those provided by the diplexer 100 discussed in Embodiment 1, and is encompassed in the scope of the present invention.

Embodiment 3

The following description will discuss a filter in accordance with Embodiment 3 of the present invention with reference to FIG. 5. (a) of FIG. 5 is a perspective view illustrating a filter 1 in accordance with Embodiment 3. (b) of FIG. 5 is a plan view of the filter 1. Note that, in the filter 1 illustrated in (b) of FIG. 5, one of each pair of opposite broad walls (broad walls 11, 21, 31, 41, 51, 61, and 71, each of which is the broad wall positioned downstream in the positive z axis direction) is not illustrated. This is for easy description of an arrangement of waveguide apertures $AP_{12}$, $AP_{23}$, $AP_{34}$, $AP_{45}$, $AP_I$, and $AP_O$.

<Resonators 10 to 50>

As illustrated in (a) and (b) of FIG. 5, the filter 1 includes: a resonator 10, a resonator 20, a resonator 30, a resonator 40, and a resonator 50; a waveguide 60; and a waveguide 70.

The resonator 10 is formed by: a pair of opposite broad walls 11 and 12; and a narrow wall 13 that resides between the broad wall 11 and the broad wall 12. The broad walls 11 and 12 are constituted by metal conductor layers. Each of the broad walls 11 and 12 is in the shape of a circle, except in the portions where the waveguide apertures $AP_I$ and $AP_{12}$ are located. The waveguide apertures $AP_I$ and $AP_{12}$ will be described later.

The narrow wall 13 is constituted by a metal conductor layer. The narrow wall 13 is in the shape of a rectangle when opened out. That is, the narrow wall 13 is a long narrow conductor. The resonator 10 is in a form such that the narrow wall 13, which is a long narrow conductor as described above, is bent along the contours of the broad walls 11 and 12 into a roll. The narrow wall 13 allows electrical communication between the broad wall 11 and the broad wall 12, and is combined with the broad wall 11 and the broad wall 12 to form a cylindrical space that is closed except for the waveguide apertures $AP_I$ and $AP_{12}$.

Each of the waveguide apertures $AP_I$ and $AP_{12}$ resembles a cut surface of a truncated cylinder (whose top and bottom faces are the broad walls 11 and 12) which is obtained by cutting off a part of the broad wall 11, a part of the broad wall 12, and a part of the narrow wall 13 in a direction intersecting (in Embodiment 3, in a direction perpendicular to) the broad walls 11 and 12. The waveguide aperture $AP_I$ allows electromagnetic coupling between the waveguide 60 (described later) and the resonator 10, whereas the waveguide aperture $AP_{12}$ allows electromagnetic coupling between the resonator 10 and a resonator 20 (described later).

Note that the thickness of this conductor layer can be set to any thickness depending on need. That is, the thickness of the conductor layer is not limited to a particular thickness, and the conductor layer may be any of general conductors in the form of a layer such as thin conductor films, conductor foil, and conductor plates.

In Embodiment 3, the metal constituting the broad walls 11 and 12 and the narrow wall 13 is aluminum. Note that this metal is not limited to aluminum, and may be copper or an alloy composed of a plurality of metallic elements. Furthermore, although the narrow wall 13 in the filter 1 illustrated in FIG. 5 is constituted by a conductor layer, the narrow wall 13 may be constituted by a post wall as illustrated in FIG. 8.

Each of the resonators 20 to 50 is configured similarly to the resonator 10. Specifically, the resonator 20 is formed by: broad walls 21 and 22 which are a pair of board walls; and a narrow wall 23. The resonator 30 is formed by: broad walls 31 and 32 which are a pair of broad walls; and a narrow wall 33. The resonator 40 is formed by: broad walls 41 and 42 which are a pair of broad walls; and a narrow wall 43. The resonator 50 is formed by: broad walls 51 and 52 which are a pair of broad walls; and a narrow wall 53. Each of the broad walls 21 and 22 is in the shape of a circle except in the portions where the waveguide apertures $AP_{12}$ and $AP_{23}$ are located, each of the broad walls 31 and 32 is in the shape of a circle except in the portions where the waveguide apertures $AP_{23}$ and $AP_{34}$ are located, each of the broad walls 41 and 42 is in the shape of a circle except in the portions where the waveguide apertures $AP_{34}$ and $AP_{45}$ are located, and each of the broad walls 51 and 52 is in the shape of a circle except in the portions where the waveguide apertures $AP_{45}$ and $AP_O$ are located. The waveguide aperture $AP_{23}$ allows electromagnetic coupling between the resonator 20 and the resonator 30, the waveguide aperture $AP_{34}$ allows electromagnetic coupling between the resonator 30 and the resonator 40, the waveguide aperture $AP_{45}$ allows electromagnetic coupling between the resonator 40 and the resonator 50, and the waveguide aperture $AP_O$ allows electromagnetic coupling between the resonator 50 and the waveguide 70 (described later).

As has been described, the filter 1 is a five-pole, resonator-coupled filter in which the five resonators 10 to 50 are electromagnetically coupled. The filter 1 functions as a band-pass filter.

<Waveguides 60 and 70>

The waveguide 60 is a rectangular waveguide whose cross section is rectangle and which is formed by a pair of broad walls (broad walls 61 and 62) and a pair of narrow walls (narrow walls 63 and 64). The waveguide 60 has, at the resonator 10-side edge, a short wall 65 that has an opening equal in shape to the waveguide aperture $AP_I$ of the resonator 10. The waveguide 60 and the resonator 10 are connected such that this opening and the waveguide aperture $AP_I$ of the resonator 10 match each other, and thereby the waveguide 60 and the resonator 10 are electromagnetically coupled to each other.

Similarly to the waveguide 60, the waveguide 70 is a rectangular waveguide which is formed by a pair of broad walls (broad walls 71 and 72) and a pair of narrow walls (narrow walls 73 and 74). The waveguide 70 and the resonator 50 are connected such that an opening in a short wall 75 of the waveguide 70 and the waveguide aperture $AP_O$ of the resonator 50 match each other, and thereby the waveguide 70 and the resonator 50 are electromagnetically coupled to each other.

In the filter 1, each of the waveguide apertures $AP_I$ and $AP_O$ functions as an input-output port. When the waveguide aperture $AP_I$ serves as an input port, the waveguide aperture $AP_O$ serves as an output port, whereas, when the waveguide aperture $AP_O$ serves as an input port, the waveguide aperture $AP_I$ serves as an output port. Either of the input-output ports can be used as an input port; however, in the description of Embodiment 3, the waveguide aperture $AP_I$ serves as an input port and the waveguide aperture $AP_O$ serves as an output port. That is, the resonator 10 corresponds to the first-pole resonator recited in the claims, and the resonator 50 corresponds to the last-pole resonator recited in the claims.

<Distance Between Centers of Resonators>

As illustrated in (a) of FIG. 5, the center of the broad wall 11 is referred to as center $C_{11}$, and the center of the broad wall 12 is referred to as center $C_{12}$. Center $C_1$ of the resonator 10 resides at the midpoint between the center $C_{11}$ and the center $C_{12}$. Center $C_2$ of the resonator 20, center $C_3$ of the resonator 30, center $C_4$ of the resonator 40, and center $C_5$ of the resonator 50 are defined in a similar manner to the center $C_1$ of the resonator 10.

As illustrated in (b) of FIG. 5, the radius of the resonator 10 is referred to as $R_1$, the radius of the resonator 20 is referred to as $R_2$, the radius of the resonator 30 is referred to as $R_3$, the radius of the resonator 40 is referred to as $R_4$, and the radius of the resonator 50 is referred to as $R_5$. Furthermore, the distance (hereinafter referred to as center-to-center distance) between the center $C_1$ and the center $C_2$ is referred to as $D_{12}$, the center-to-center distance between the center $C_2$ and the center $C_3$ is referred to as $D_{23}$, the center-to-center distance between the center $C_3$ and the center $C_4$ is referred to as $D_{34}$, and the center-to-center distance between the center $C_4$ and the center $C_5$ is referred to as $D_{45}$. Note that the broad walls 11, 12, 21, 22, 31, 32, 41, 42, 51, and 52 of the resonators 10 to 50 are each in a circular shape. As such, the radii of the circumcircles of the broad walls 11, 12, 21, 22, 31, 32, 41, 42, 51, and 52 are equal to the radii $R_1$ to $R_5$ of the resonators 10 to 50, respectively.

In the above arrangement, the radius $R_1$, the radius $R_2$, and the center-to-center distance $D_{12}$ satisfy the condition $D_{12}<R_1+R_2$, the radius $R_2$, the radius $R_3$, and the center-to-center distance $D_{23}$ satisfy the condition $D_{23}<R_2+R_3$, the radius $R_3$, the radius $R_4$, the center-to-center distance $D_{34}$ satisfy the condition $D_{34}<R_3+R_4$, and the radius $R_4$, the radius $R_5$, and the center-to-center distance $D_{45}$ satisfy the condition $D_{45}<R_4+R_5$. Provided that such a condition is satisfied, two cylindrical resonators (for example, the resonator 10 and the resonator 20) can be coupled to each other via a waveguide aperture in the side walls of the resonators (for example, via the waveguide aperture $AP_{12}$).

<Symmetry of Two Adjacent Resonators>

Of the plurality of resonators in the filter 1, a focus is placed on two adjacent resonators coupled to each other. The following description is based on the resonator 20 and the resonator 30. The shape of a combination of the broad wall 21 or 22 and the broad wall 31 or 32 (equal to the shape of a combination of the circumcircles of the resonators 20 and 30) of the two resonators 20 and 30 is symmetric with respect to line BB' that connects the centers $C_2$ and $C_3$ of the two circumcircles together (see (b) of FIG. 5). As such, the degree of symmetry of the two resonators coupled to each other in the filter 1 is higher than that of the conventional filter (filter illustrated in FIGS. 1 and 2 of Patent Literature 1). This makes it possible to reduce the number of design parameters. Thus, the filter 1 makes it possible to easily design a filter with desired characteristics as compared to the conventional filter.

Note that, in the filter 1, not only two resonators coupled to each other but also the filter 1 as a whole is symmetric with respect to a line. Specifically, the resonators 10 to 50 are arranged such that they are symmetric with respect to a line that is parallel to the x axis and that passes through the center $C_3$ of the resonator 30, and the waveguides 60 to 70 are arranged such that they are symmetric with respect to that line. As such, the filter 1 has a high degree of symmetry also concerning the shape of the filter 1 as a whole. This makes it possible to further reduce the number of design parameters. Thus, the filter 1 makes it possible to more easily design a filter with desired characteristics as compared to the conventional filter.

<Arrangement of Resonators 10 and 50>

In the filter 1, the resonator 10 and the resonator 50 are arranged so as to be adjacent to each other (see (a) and (b) of FIG. 5). Therefore, the total length of the filter can be reduced as compared to when a plurality of resonators are arranged in a straight line. A reduction in total length of the filter makes it possible to reduce the absolute value of thermal expansion or thermal contraction that would result from a change in ambient temperature around the filter 1. As such, the filter 1, whose total length is shorter than that of the conventional filter, is capable of reducing changes in center frequency of a passband, bandwidth, and the like that would result from changes in ambient temperature. In other words, the characteristics of the filter 1 are highly stable to changes in ambient temperature.

<Arrangement of Waveguide Apertures $AP_I$ and $AP_O$>

As illustrated in (b) of FIG. 5, the waveguide aperture $AP_I$, which serves as an input port, is provided in a region that is on the opposite side (positioned downstream in the negative y axis direction) of the resonator 10 from the side (positioned downstream in the positive y axis direction) facing the resonator 50 and that intersects line AA'. The line AA' is a straight line that passes through the center $C_1$ of the resonator 10 and the center $C_5$ of the resonator 50.

Similarly, the waveguide aperture $AP_O$, which serves as an output port, is provided in a region that is on the opposite side (positioned downstream in the positive y axis direction) of the resonator 50 from the side (positioned downstream in the negative y axis direction) facing the resonator 10 and that intersects the line AA'.

Since the filter 1 includes the waveguide apertures $AP_I$ and $AP_O$, the waveguides 60 and 70 can be easily coupled to the input port and the output port, respectively. In addition, the input port and the output port are positioned such that they intersect a single straight line (line AA'). Therefore, the filter 1 makes it possible to cause line CC', which is the central axis of the waveguide 60, and line DD', which is the central axis of the waveguide 70, to coincide with each other. It follows that two such filters 1 can be arranged so as to run along each other. Thus, the filter 1 can be suitably used as, for example, a filter that resides between a pair of directional couplers of a diplexer.

Note that, by adjusting (optimizing) the offset $\Delta_{offI}$ which is the distance between the line AA' and the line CC', it is possible to reduce return loss that would occur at the junction between the waveguide 60 and the resonator 10, that is, at the waveguide aperture $AP_I$. Similarly, by adjusting (optimizing) the offset $\Delta_{offO}$ which is the distance between the line AA' and the line DD', it is possible to reduce return loss that would occur at the junction between the waveguide 70 and the resonator 50, that is, at the waveguide aperture $AP_O$. The filter 1 preferably has a shape which is symmetric with respect to a straight line that passes through the center $C_3$ and that is parallel to the x axis. Therefore, it is preferable that the offset $\Delta_{offI}$ and the offset $\Delta_{offO}$ are equal to each other.

Furthermore, there may be cases where changes of the design width $W_6$ of the waveguide 60 and the design width $W_7$ of the waveguide 70 lead to an increase in return loss at the waveguide aperture $AP_I$ and the waveguide aperture $AP_O$. In the filter 1, the design parameters for the resonators 10 to 50 can be set independently of the widths $W_6$ and $W_7$, and, in addition, adjustments of the offsets $\Delta_{off}$ make it possible to reduce the return loss. As such, the filter 1 is a filter in which the widths of the respective waveguides 60 and 70 can be easily changed with little or no increase in return loss at the waveguide aperture $AP_I$ and the waveguide aperture $AP_O$.

(Variations 1 to 4)

The following description will discuss filters 1a to 1d which are Variations 1 to 4 of the filter 1, with reference to (a) to (d) of FIG. 6. (a) to (d) of FIG. 6 are plan views of the respective filters 1a to 1d. In the filters 1a to 1d shown in (a) to (d) of FIG. 6, respectively, one of each pair of broad walls is not illustrated.

The filter 1a includes the following six resonators: resonators 10a, 20a, 30a, 40a, 50a, and 60a. The filter 1b includes the following seven resonators: resonators 10b, 20b, 30b, 40b, 50b, 60b, and 70b. The filter 1c includes the following eight resonators: resonators 10c, 20c, 30c, 40c, 50c, 60c, 70c, and 80c. The filter 1d includes the following eleven resonators: resonators 10d, 20d, 30d, 40d, 50d, 60d, 70d, 80d, 90d, 100d, and 110d.

As described above, in a filter in accordance with an aspect of the present invention, the number of resonators of the filter is not limited. The number of resonators of a filter, in other words, the number of poles of a filter, can be any number depending on the desired filter characteristics (such as the center frequency of a passband, bandwidth, and cutoff sharpness at about lower limit frequency and upper limit frequency of the passband), and the number may be an odd number or an even number.

(Variations 5 and 6)

The following description will discuss filters 1e and 1f which are Variations 5 and 6 of the filter 1, with reference to (a) and (b) of FIG. 7. (a) and (b) of FIG. 7 are plan views of the respective filters 1e and 1f. In the filters 1e and 1f shown in (a) and (b) of FIG. 7, respectively, one of each pair of broad walls is not illustrated.

The filter 1e includes the following six resonators: resonators 10e, 20e, 30e, 40e, 50e, and 60e. The filter 1e includes broad walls each in the shape of a regular hexagon, in place of the circular broad walls 11, 12, 21, 22, 31, 32, 41, 42, 51, and 52 of the filter 1 illustrated in (b) of FIG. 5. The resonator 10e includes a pair of broad walls 12e each in the shape of a regular hexagon, one of which is not illustrated in (a) of FIG. 7. Similarly, the resonators 20e to 60e include pairs of broad walls 22e to 62e each in the shape of a regular hexagon, respectively.

Circumcircles $CC_{1e}$ to $CC_{6e}$ are circumcircles of the broad walls 12e to 62e, respectively. As such, a variation of the filter 1 may employ the broad walls 12e to 62e each in the shape of a regular polygon. Even in cases where the broad walls 12e to 62e are each in the shape of a regular polygon, the filter 1e brings about similar effects to those provided by the filter 1 illustrated in FIG. 5, provided that two resonators are arranged such that $D<R_1+R_2$ is satisfied, where $R_1$ and $R_2$ represent the radii of circumcircles of broad walls of two resonators coupled to each other and D represents the center-to-center distance between these two resonators.

The filter 1f includes the following four resonators: resonators 10f, 20f, 30f, and 40f. The resonator 10f includes a broad wall 12f in the shape of a regular octagon. Similarly, the resonators 20f to 40f include respective broad walls 22f to 42f each in the shape of a regular octagon.

Note that the shape employed in a filter in accordance with an aspect of the present invention is not limited to a regular hexagon and a regular octagon, and may be any regular polygon with six or more vertices.

Configuration Example

The following description will discuss another example of a configuration of the filter 1 illustrated in FIG. 5, with reference to FIGS. 8 and 9. FIG. 8 is a perspective view illustrating an example of a configuration in which the filter 1 is arranged using a post-wall waveguide technique. In FIG. 8, the conductor layers 2 and 4 are drawn in imaginary lines (dot-dot-dash lines). This is for easy description of a plurality of conductor posts in the substrate 3. (a) and (b) of FIG. 9 are a plan view and a cross-sectional view of a converter 80, respectively. The converter 80 is capable of being provided at an end of the waveguide 60 connected to the input port of the filter 1 illustrated in FIG. 8.

<Post-Wall Waveguide>

The filter 1 in accordance with this configuration example employs a post-wall waveguide technique, and is constituted by the substrate 3 made of a dielectric material having the conductor layer 2 and the conductor layer 4 on opposite surfaces thereof. The substrate 3 corresponds to the dielectric substrate recited in the claims. The conductor layer 2 and the conductor layer 4, which are a pair of conductor layers, function as a pair of broad walls that form the resonators 10 to 50 and the waveguides 60 to 70. The substrate 3 has therein a plurality of through-holes that pass through the substrate 3 from one surface of the substrate 3 to the other surface of the substrate 3. The through-holes each have a conductor film on the inner wall thereof such that the conductor layer 2 and the conductor layer 4 are in electrical communication with each other. That is, each of the through-holes has a conductor post therein which allows the conductor layer 2 and the conductor layer 4 to be in electrical communication with each other.

A post wall (the conductor post group recited in the claims) constituted by a plurality of conductor posts arranged at certain intervals in a palisade arrangement functions as a kind of conducting wall that reflects electromagnetic waves within a band that depends on the intervals. The filter 1 in accordance with this configuration example employs such post walls as narrow walls that form the resonators 10 to 50 and the waveguides 60 to 70.

For example, the narrow wall 13 of the resonator 10 is constituted by a plurality of conductor posts 13i (i is a positive integer) arranged in a circle in a palisade arrangement. Similarly, the narrow walls 23 to 53 of the resonators 20 to 50 are constituted by pluralities of conductor posts 23i to 53i, respectively, and the narrow walls 63, 64, 73, and 74 of the waveguides 60 to 70 are constituted by pluralities of conductor posts 63i, 64i, 73i, and 74i, respectively.

The waveguide aperture $AP_{12}$, through which the resonator 10 and the resonator 20 are electromagnetically coupled, is formed by missing one(s) of the conductor posts 13i and missing one(s) of the conductor posts 23i. The waveguide apertures $AP_{23}$, $AP_{34}$, $AP_{45}$, $AP_I$, and $AP_O$ are formed in a similar manner.

The filter 1 that employs a post-wall waveguide technique can be easily produced and can be reduced in weight, as compared to a filter 1 that employs a metal waveguide tube technique.

<Converter>

In the filter 1 illustrated in FIG. 8, the waveguide 60 may have the converter 80 illustrated in FIG. 9 provided at its opposite end from the resonator 10 (at the end positioned downstream in the negative y axis direction). Similarly, the waveguide 70 may have the converter 80 provided at its opposite end from the resonator 50 (at the end positioned downstream in the positive y axis direction). The following description is based on the converter 80 provided at the end of the waveguide 60 as an example.

In the case where the converter 80 is provided at the end of the waveguide 60, a short wall 66 is formed at that end. The short wall 66 is a post wall constituted by a plurality of conductor posts 66i arranged in a palisade arrangement. The short wall 66 is a counterpart of the short wall 65, and closes the opposite end of the waveguide 60 from the resonator 10.

As illustrated in (a) and (b) of FIG. 9, the converter 80 includes a signal line 85, a pad 86, a blind via 87, and electrodes 88 and 89.

A dielectric layer 5 is a layer made of a dielectric material provided on a surface of the conductor layer 2. The dielectric layer 5 has an opening 5a that overlaps a waveguide of the converter 80. The conductor layer 2 of the converter 80 has an opening 2a that overlaps the opening 5a. The opening 2a is formed such that the opening 2a includes the opening 5a within its range. The opening 2a functions as an anti-pad.

The signal line 85 is a long narrow conductor disposed on a surface of the dielectric layer 5. One end portion of the signal line lies in a region that surrounds the opening 5a and that overlaps the opening 2a. The signal line 85 and the conductor layer 2 form a microstrip line.

The pad 86 is a circular conductor layer provided on the surface of the substrate 3 on which the conductor layer 2 is provided. The pad 86 is located within the opening 2a in the conductor layer 2 such that the pad 86 is insulated from the conductor layer 2.

The substrate 3 has, on the surface thereof, a non-through-hole extending inward from the surface on which the conductor layer 2 is provided. The blind via 87 is constituted by a tube-shaped conductor film disposed on the inner wall of the non-through-hole. The blind via 87 is connected to the one end portion of the signal line 85 via the pad 86 so that the blind via 87 and the signal line 85 are in electrical communication with each other. Specifically, the blind via 87 is connected to the one end portion of the signal line 85 and is formed in the substrate 3 through the openings 2a and 5a. The blind via 87 corresponds to the conductor pin recited in the claims.

The electrodes 88 and 89 are disposed on the surface of the dielectric layer 5. The electrodes 88 and 89 are each located near the other end portion of the signal line 85 such that the other end portion of the signal line 85 lies between the electrodes 88 and 89.

The dielectric layer 5 has a plurality of through-holes in a region that overlaps the electrode 58. The plurality of through-holes are filled with conductors serving as vias 88A. The vias 88A achieve a short circuit between the electrode 88 and the conductor layer 2. Vias 89A, which are configured similarly to the vias 88A, achieve a short circuit between the electrode 89 and the conductor layer 2. The thus-configured electrode 88 and electrode 89 each function as a ground, and therefore the electrode 88, the electrode 89, and the single line 85 achieve a ground-signal-ground interface.

The thus-configured converter 80 carries out a conversion between a mode that propagates through the microstrip line and a mode that propagates through the waveguide 60. Therefore, the converter 80 is capable of easily coupling the microstrip line to each of the input and output ports. Furthermore, an RFIC can be easily connected to the interface constituted by the signal line 85 and the electrodes 88 and 89, with use of a bump or the like.

This configuration example was described based on the assumption that the converter 80 is provided at the end of the waveguide 60 or the end of the waveguide 70. That is, the configuration example was described based on the assumption that the converter 80 is coupled to the resonator 10 or the resonator 50 via the waveguide 60 or the waveguide 70. However, the converter 80 may be provided so as to be directly coupled to the resonator 10 to the resonator 50. Specifically, the blind via 87 of the converter 80 may be formed in the resonator 10 or the resonator 50 so as to extend inward from an opening in a part of the broad wall 11 of the resonator 10 or a part of the broad wall 51 of the resonator 50.

Embodiment 4

The following description will discuss a filter in accordance with Embodiment 4 of the present invention, with reference to FIG. 10. (a) of FIG. 10 is a perspective view illustrating a filter 201 in accordance with Embodiment 4. (b) of FIG. 10 is a plan view of the filter 201. Note that, in the filter 201 illustrated in (b) of FIG. 10, a conductor layer 202 constituting one of a pair of broad walls (the broad wall positioned downstream in the positive z axis direction) is not illustrated. This is for easy description of arrangements of conductor posts constituting narrow walls 213, 223, 233, 243, 253, 263, 264, 273, and 274 that form resonators 210 to 250 and waveguides 260 and 270.

The filter 201 is different from the filter 1 illustrated in FIG. 8 in that the filter 201 further includes conductor posts 214, 224, 234, 244, and 254. Therefore, in Embodiment 4, the conductor posts 214, 224, 234, 244, and 254 are described, and descriptions for the rest of the configuration are omitted. Note that the reference numbers assigned to the members of the filter 201 are obtained by changing those of the members of the filter 1 such that each of the reference numbers is in the 200s.

The conductor posts 214, 224, 234, 244, and 254 are described based on the conductor post 214 as an example. The conductor post 214 is a projection made of a conductor that projects inward from one of the broad walls of the resonator 210 (from a part of the conductor layer 2) to reach the other of the broad walls of the resonator 210 (reach a part of the conductor layer 4). The conductor post 214 is similar in configuration to the conductor posts constituting the narrow wall 213. The conductor posts 224, 234, 244, and 254 are configured in a similar manner to the conductor post 214.

Since the resonator 210 includes the conductor post 214, resonance frequency can be changed, that is, can be caused to differ from that of the resonator 210 which includes no conductor post 214. It follows that the resonance frequency of the filter 201 can be changed.

The degree of change in resonance frequency that results from the addition of the conductor post 214 can be changed by adjusting the position of the conductor post 214. This means that the position of the conductor post 214 can be used as a design parameter for adjusting characteristics of the filter 201. Thus, the characteristics of the filter 201 can be easily adjusted without having to change the design shapes of the respective resonators 210 to 250.

Note that, in the filter 201, the resonators 210 to 250 have the respective conductor posts 214 to 254, which are projections. However, such a projection need only be provided in at least one resonator.

(Variation 7)

The following description will discuss a filter 301 which is Variation 7 of the present invention, with reference to FIG. 11. FIG. 11 is a perspective view of the filter 301. The filter 301 is different from the configuration of the filter 201 in that the filter 301 employs projections 314, 324, 334, 344, and 354 in place of the conductor posts 214, 224, 234, 244, and 254. Therefore, in Variation 7, the projections 314 to 354 are described, and descriptions for the rest of the configuration are omitted. Note that the reference numbers assigned to the members of the filter 301 are obtained by changing those of the members of the filter 201 such that each of the reference numbers is in the 300s.

The projection 314 is a projection made of a conductor that projects inward from a broad wall 311, which is one of the broad walls of a resonator 310. When the projection 314 and the conductor post 214 are compared, the projection 314 (1) is closer to the center of the broad wall 311 (center of the resonator 310) than the conductor post 214 and (2) projects from the broad wall 311 to a lesser extent than the conductor post 214. The projections 324, 334, 344, and 354 are configured in a similar manner to the projection 314.

The degree of change in resonance frequency that results from the formation of the projection 314 (or the conductor post 214) (1) becomes smaller as the distance from the projection 314 (or the conductor post 214) to a narrow wall 313 (or 213) becomes smaller, and becomes larger as the distance from the projection 314 (or the conductor post 214) to the center of the broad wall 311 (or 211) becomes smaller and (2) becomes smaller as the amount of projection of the projection 314 (or the conductor post 214) decreases, and becomes larger as the amount of projection of the projection 314 (or the conductor post 214) increases.

In cases where a projection is positioned at or near the center of the broad wall 311 like the projection 314, the amount of projection is preferably small so that a change in resonance frequency does not become too large.

As such, by adjusting the position of a projection and the amount of projection, it is possible to easily adjust the characteristics of the filter 301 without having to change the design shapes of the respective resonators 310 to 350.

Example and Comparative Example

The following description will discuss a filter 1, which is an Example of the present invention, and a filter 501, which is a Comparative Example, with reference to FIGS. 12 to 14. FIG. 12 is a plan view illustrating the filter 1 and the filter 501. (a) of FIG. 13 is a chart showing reflection characteristics (frequency dependence of S-parameter S(1, 1)) of the filter 1 and the filter 501. (b) of FIG. 13 is a chart showing transmission characteristics (frequency dependence of S-parameter S(2, 1)) of the filter 1 and the filter 501. (a) of FIG. 14 is a contour diagram showing an electric field distribution in the filter 1. (b) of FIG. 14 is a contour diagram showing an electric field distribution in the filter 501.

The above filter 1 is the same as the filter 1 illustrated in FIG. 5 in which the radii of broad walls of resonators and the center-to-center distances between the broad walls, which are design parameters, are set as below. Note that the values of $D_{12}$, $D_{45}$, $D_{23}$, and $D_{34}$ have been rounded off to the nearest integers.

$R_1$, $R_5$=749 μm
$R_2$, $R_4$=787 μm
$R_3$=792 μm
$D_{12}$, $D_{45}$=1446 μm
$D_{23}$, $D_{34}$=1449 μm

The filter 501 is a resonator-coupled filter in which rectangle resonators 510, 520, 530, 540, and 550 are coupled in a straight line, and the length and width of the resonators 510 to 550 are set as shown in FIG. 12.

The above design parameters for the filter 1 were set so that the characteristics of the filter 1 would be as close as possible to those of the filter 501.

(a) and (b) FIG. 13 show that the characteristics of the filter 1 match to a great extent with the characteristics of the filter 501. The S-parameters S(1, 1) in the passband indicate that the filter 1 reduces the reflection to a greater extent, and the S-parameters S(2, 1) in the passband indicate that the filter 1 shows a higher transmittance.

(a) of FIG. 14 shows that, in the filter 1, an electromagnetic wave coupled from the waveguide 60 to the resonator 10 propagates through the resonators 20 to 40 to the resonator 50, and is coupled from the resonator 50 to the waveguide 70. (a) of FIG. 14 also shows that an electric field is distributed throughout the resonators 10 to 50. On the contrary, (b) of FIG. 14 shows that the resonators 510 to 550 have, at their corners, some areas in which no electric field is distributed (or the strength of the electric field is very low). It is inferred that such a difference between the filter 1 and the filter 501 is attributed to a difference in shape of the broad walls of the resonators. These results demonstrate that, in the filter 1, cavities of the respective resonators can be used more effectively than those of the filter 501, because the shapes of the broad walls are circular except in the portions where the waveguide apertures $AP_I$, $AP_{12}$, $AP_{23}$, $AP_{34}$, $AP_{45}$, and $AP_O$ are located.

As is clear from the above results, the use of the resonators 10 to 50, whose broad walls are circular in shape, made it possible to design a compact filter 1 having characteristics equal to or better than those of the filter 501 which includes the resonators 510 to 550 whose broad walls are rectangular in shape.

Embodiment 5

The following description will discuss a diplexer in accordance with Embodiment 5 of the present invention with reference to FIG. 15. (a) of FIG. 15 is a block diagram illustrating a diplexer 600 in accordance with Embodiment 5. (b) of FIG. 15 is a plan view of the diplexer 600.

As illustrated in (a) and (b) of FIG. 15, the diplexer 600 includes a filter 601A, a filter 601B, a filter 601C, a directional coupler 606A, and a directional coupler 606B, and is produced using a post-wall waveguide technique. Specifically, the diplexer 600 is comprised of a substrate made of a dielectric material having conductor layers formed on respective opposite surfaces thereof. (b) of FIG. 15 illustrates a conductor layer 602 which is one of the conductor layers on the opposite surfaces of the substrate and which is positioned downstream in the positive z axis direction, and does not illustrate the substrate and the other (which is positioned downstream in the negative z axis direction) of the conductor layers on the opposite surfaces of the substrate.

Note that, in (a) of FIG. 15, narrow walls that form parts of the filter 601A, the filter 601B, the filter 601C, the directional coupler 606A, and the directional coupler 606B are each illustrated in the form of an imaginary plane wall obtained by connecting the central axes of conductor posts, instead of the form of a post wall constituted by a plurality of conductor posts arranged in a palisade arrangement.

The filter 601A, the filter 601B, the filter 601C, the directional coupler 606A, and the directional coupler 606B correspond to the first filter, the second filter, the third filter, the first directional coupler, and the second directional coupler recited in the claims, respectively.

<Filters 601A and 601B>

The filter 601A and the filter 601B are similar in configuration to the filter 101A and the filter 101b illustrated in FIG. 3, respectively. The filter 601A is comprised of the following five resonators: resonators 610A, 620A, 630A, 640A, and 650A which are electromagnetically coupled via waveguide apertures $AP_{12A}$, $AP_{23A}$, $AP_{34A}$, and $AP_{45A}$. The filter 601B is comprised of the following five resonators: resonators 610B, 620B, 630B, 640B, and 650B which are electromagnetically coupled via waveguide apertures $AP_{12B}$, $AP_{23B}$, $AP_{34B}$, and $AP_{45B}$.

The resonators 610A, 620A, 630A, 640A, and 650A are equal in configuration to the resonators 110A, 120A, 130A, 140A, 150A of the filter 101A, respectively, and the resonators 610B, 620B, 630B, 640B, and 650B are equal in configuration to the resonators 110B, 120B, 130B, 140B, and 150B of the filter 101B, respectively. Therefore, in Embodiment 5, the descriptions for the resonators 610A, 620A, 630A, 640A, and 650A and the descriptions for the resonators 610B, 620B, 630B, 640B, and 650B are omitted.

In other words, each of the filters 601A and 601B is similar in configuration to the filter 1 illustrated in FIG. 8. In this case, the filter 601B is obtained by moving the filter 1 illustrated in FIG. 8 such that the resulting filter (filter 601B) and the filter 1 are reflection symmetric about a plane that extends along the yz plane in the coordinate system shown in FIG. 8 and that contains the narrow walls 63 and 73. That is, the filter 601B is obtained by a reflection of the filter 1 illustrated in FIG. 8 across the above-described plane. Note that, in a case where the filter 601B is obtained by a reflection of the filter 1, the conductor layer 4 of the filter 1 corresponds to a conductor layer 604 of the filter 601B, whereas the conductor layer 2 of the filter 1 corresponds to the conductor layer that is a counterpart of the conductor layer 602 of the filter 601B.

Note that, in the filter 601A, the waveguide 160A included in the filter 101A is omitted and a waveguide 681A of the directional coupler 606A (described later) is connected to the resonator 610A, and the waveguide 170A included in the filter 101A is omitted and a waveguide 681B of the directional coupler 606B (described later) is connected to the resonator 650A. A waveguide aperture $AP_{IA}$ in a narrow wall 613A of the resonator 610A corresponds to a port P5 illustrated in (a) of FIG. 15. A waveguide aperture $AP_{OA}$ in a narrow wall 653A of the resonator 650A corresponds to a port P6 illustrated in (a) of FIG. 15.

Similarly, in the filter 601B, the waveguide 160B included in the filter 101B is omitted and a waveguide 682A of the directional coupler 606A (described later) is connected to the resonator 610B, and the waveguide 170B included in the filter 101B is omitted and a waveguide 682B of the directional coupler 606B (described later) is connected to the resonator 650B. A waveguide aperture $AP_{IB}$ in a narrow wall 613B of the resonator 610B corresponds to a port P7 illustrated in (a) of FIG. 15. A waveguide aperture $AP_{OB}$ in a narrow wall 653B of the resonator 650B corresponds to a port P8 illustrated in (a) of FIG. 15.

Note that the filter 601A and the filter 601B are designed using equal design parameters such that both have the band $f_1$ which is an identical passband. That is, the filter 601A and the filter 601B are equal in shape. In this regard, the filter 601A and the filter 601B are similar to the filters 101A and 101B of the diplexer 100 illustrated in FIG. 3. The band $f_1$ corresponds to the first frequency band recited in the claims. On the contrary, the passband of the filter 601C (described later) is the band $f_2$ which is a different frequency band from the band $f_1$. The band $f_2$ corresponds to the second frequency band recited in the claims.

<Directional Couplers 606A and 606B>

Each of the directional couplers 606A and 606B is the same as the directional coupler 106A illustrated in FIG. 2 except for their shapes. The directional coupler 606A and the directional coupler 606B are reflection symmetric about a zx plane that contains the center of the resonator 630A and the center of the resonator 630B. Therefore, Embodiment 5 mainly discusses the directional coupler 606A.

As illustrated in (b) of FIG. 15, the directional coupler 606A includes: the waveguide 681A which is a first waveguide; and the waveguide 682A which is a second waveguide. The waveguide 681A is a waveguide whose four faces are constituted by: a narrow wall 683A and a narrow wall 684A which are a pair of narrow walls; and conductor layers (conductor layers formed on opposite surfaces of the substrate) which are a pair of broad walls. The waveguide 682A and the waveguide 681A share the narrow wall 683A. The waveguide 682A is a waveguide whose four faces are constituted by: the narrow wall 683A and a narrow wall 685A which are a pair of narrow walls; and the conductor layers (which are on the opposite surfaces of the substrate) which are a pair of broad walls.

The narrow wall 683A has a waveguide aperture $AP_{680A}$ in a part thereof. The waveguide aperture $AP_{680A}$ is formed by missing one(s) of the conductor posts constituting the narrow wall 683A. The waveguide 681A and the waveguide 682A are electromagnetically coupled to each other via the waveguide aperture $AP_{680A}$.

The waveguide aperture $AP_{680A}$ has one conductor post 686A in the middle thereof. The conductor post 686A is a conductor post that is shorter than the conductor posts that constitute the narrow wall 683A. The conductor post 686A projects from the conductor layer 602 toward the interior of the substrate, and its tip, which is the opposite end of the conductor post 686A from the conductor layer 602, is positioned within the interior of the substrate. That is, the tip of the conductor post 686A is short of the opposite conductor layer that is a counterpart of the conductor layer 602.

The directional coupler 606A, which includes the conductor post 686A, is capable of reducing input reflection coefficient and separation coefficient as compared to the directional coupler 106A illustrated in FIG. 2. The input reflection coefficient here is represented by the ratio of the power of a signal reflected at a certain port (e.g., port P1) to the power of a signal inputted to the certain port. It can be said that a smaller input reflection coefficient means a lower return loss of a directional coupler. The separation coefficient here is an indicator that is indicative of how easily a signal is transmitted from a certain port (e.g., port P1) to an isolation port. It can be said that a smaller separation coefficient means better isolation characteristics of a directional coupler.

As described above, the directional coupler 606A preferably includes the conductor post 686A. This conductor post 686A can also be employed in the directional couplers 106A and 106B included in the diplexer 100 illustrated in FIG. 1.

The directional coupler 606A includes four ports, that is: a port, which is positioned downstream in the negative y axis direction, of the waveguide 681A; a port, which is positioned downstream in the positive y axis direction, of the waveguide 681A; a port, which is positioned downstream in the negative y axis direction, of the waveguide 682A; and a port, which is positioned downstream in the positive y axis direction, of the waveguide 682A. The port, which is positioned downstream in the negative y axis direction, of the waveguide 681A and the port, which is positioned downstream in the negative y axis direction, of the waveguide 682A correspond to the port P1 and a port P2 illustrated in (a) of FIG. 15, respectively. The port, which is positioned downstream in the positive y axis direction, of the waveguide 681A and the port, which is positioned downstream in the positive y axis direction, of the waveguide 682A are coupled to the port P5 of the resonator 610A and the port P7 of the resonator 610B, respectively.

As described earlier, the directional coupler 606B is equal in configuration to the directional coupler 606A. The directional coupler 606B includes four ports, that is: a port, which is positioned downstream in the positive y axis direction, of the waveguide 681B; a port, which is positioned downstream in the negative y axis direction, of the waveguide 681B; a port, which is positioned downstream in the positive y axis direction, of the waveguide 682B; and a port, which is positioned downstream in the negative y axis direction, of the waveguide 682B. The port, which is positioned downstream in the positive y axis direction, of the waveguide 681B and the port, which is positioned downstream in the positive y axis direction, of the waveguide 682B correspond to a port P3 and a port P4 illustrated in (a) of FIG. 15, respectively. The port, which is positioned downstream in the negative y axis direction, of the waveguide 681B and the port, which is positioned downstream in the negative y axis direction, of the waveguide 682B are coupled to the port P6 of the resonator 650A and the port P8 of the resonator 650B, respectively.

<Filter 601C>

The diplexer 600 is different from the diplexer 100 illustrated in FIG. 1 in that the diplexer 600 further includes the filter 601C which is a third filter. The filter 601C is designed such that the passband of the filter 601C is the band $f_2$ which is different from the band $f_1$ (the passband of the filters 101A and 101B).

The filter 601C is comprised of five resonators, that is, resonators 610C, 620C, 630C, 640C, and 650C which are electromagnetically coupled via waveguide apertures $AP_{12C}$, $AP_{23C}$, $AP_{34C}$, and $AP_{45C}$, similarly to the filter 101A and the filter 101B illustrated in FIG. 3 or the filter 1 illustrated in FIG. 8 (see (b) of FIG. 15). Therefore, Embodiment 5 mainly discusses a different part of the configuration of the filter 601C from those of the filter 101A, the filter 101B, and the filter 1.

In the filter 601C, a narrow wall 613C of the resonator 610C has a waveguide aperture $AP_{IC}$. The waveguide aperture $AP_{IC}$ is electromagnetically coupled to the end, which is positioned downstream in the negative y axis direction, of the waveguide 681A of the directional coupler 606A (that is, coupled to the port P1 illustrated in (a) of FIG. 15). Assuming that the filter 601C is described based on the filter 1, the waveguide 60 of the filter 1 is omitted in the filter 601C.

In the filter 601C, a narrow wall 653C of the resonator 650C has a waveguide aperture $AP_{OC}$, which is electromagnetically coupled to a waveguide 670C. The waveguide 670C corresponds to the waveguide 70 of the filter 1. Note, however, that the dimension of the waveguide 670C along the y axis is short and is substantially equal to the dimension along the x axis. As such, the waveguide 670C of the filter 601C can also be regarded as a sixth resonator.

As shown in (b) of FIG. 15, the radius of the resonator 610C is referred to as $R_{61}$, the radius of the resonator 620C is referred to as $R_{62}$, the radius of the resonator 630C is referred to as $R_{63}$, the radius of the resonator 640C is referred to as $R_{64}$, and the radius of the resonator 650C is referred to as $R_{65}$. Furthermore, the center-to-center distance between center $C_{61}$ of the resonator 610C and center $C_{62}$ of the resonator 620C is referred to as $D_{612}$, the center-to-center distance between the center $C_{62}$ and center $C_{63}$ of the resonator 630C is referred to as $D_{623}$, the center-to-center distance between the center $C_{63}$ and center $C_{64}$ of the resonator 640C is referred to as $D_{634}$, and the center-to-center distance between the center $C_{64}$ and center $C_{65}$ of the resonator 650C is referred to as $D_{645}$.

In the above arrangement, $R_{61}$, $R_{62}$ and $D_{612}$ satisfy the condition $D_{612}<R_{61}+R_{62}$, $R_{62}$, $R_{63}$ and $D_{623}$ satisfy the condition $D_{623}<R_{62}+R_{63}$, $R_{63}$, $R_{64}$ and $D_{634}$ satisfy the condition $D_{634}<R_{63}+R_{64}$, and $R_{64}$, $R_{65}$ and $D_{645}$ satisfy the condition $D_{645}<R_{64}+R_{65}$. Provided that such a condition is satisfied, two cylindrical resonators (e.g., the resonator 610C and the resonator 620C) can be coupled together via a waveguide aperture (e.g., waveguide aperture $AP_{12C}$) in the side faces of the resonators.

Note that the centers $C_{61}$, $C_{62}$, $C_{63}$, $C_{64}$, and $C_{65}$ of the respective resonators 610C, 620C, 630C, 640C, and 650C are each defined in a similar manner to the center $C_1$ of the resonator 10 described earlier with reference to (a) of FIG. 5.

The filter 601C is different from the filter 1 in terms of the arrangement of the resonators 610C, 620C, 630C, 640C, and 650C. Each of the resonators 610C, 620C, 630C, 640C, and 650C of the filter 601C is located on the circumference of reference circle C illustrated in (b) of FIG. 15. The reference circle C is any circle that encloses the filter 601A and the filter 601B, and its diameter 2R is equal to or less than length L. As used herein, the term "length L" refers to the distance from the end, which is positioned downstream in the negative y axis direction, of the waveguide 682A (i.e., the opposite end of the waveguide 682A from the filter 601B) to the end, which is positioned downstream in the positive y axis direction, of the waveguide 682B (i.e., the opposite end of the waveguide 682B from the filter 601B).

In this specification, a state in which a certain resonator is located on the circumference of the reference circle C means that a narrow wall of the resonator intersects or is in contact with the circumference of the reference circle C when the diplexer 600 is seen in plan view (see (b) of FIG. 15). Note that also when a waveguide aperture of a resonator intersects the circumference of the reference circle C, it is determined that the resonator is located on the circumference of the reference circle C. For example, the narrow wall 613, including the waveguide aperture $AP_{12C}$, of the resonator 610C intersects the circumference of the reference circle C at two points; therefore, the resonator 610C is located on the circumference of the reference circle C.

<Converters 80A to 80D>

In the diplexer 600, the waveguide 670C has a converter 80A provided thereto, the waveguide 682A has a converter 80B provided at its end positioned downstream in the negative y axis direction (at the opposite end from the filter 601B), the waveguide 681B has a converter 80C provided at its end positioned downstream in the positive y axis direction (at the opposite end from the filter 601A), and the waveguide 682B has a converter 80D provided at its end positioned downstream in the positive y axis direction (at the opposite end from the filter 601B).

As such, when (a) of FIG. 15 and (b) of FIG. 15 are compared to each other, the converter 80A corresponds to a port P9, the converter 80B corresponds to the port P2, the converter 80C corresponds to the port P3, and the converter 80D corresponds to the port P4. These four ports P1 to P4 function as four ports of the diplexer 600.

Each of the converters 80A to 80D is equal in configuration to the converter 80 illustrated in FIG. 9. Therefore, the descriptions for the converters 80A to 80D are omitted in Embodiment 5.

This arrangement allows for easy connection of an integrated circuit that has a ground-signal-ground interface, such as a receiver circuit (Rx), a transmitter circuit (Tx), or an antenna circuit, to each of the ports P9, P2, and P3.

Furthermore, in cases where the port P4 is terminated as illustrated in (a) of FIG. 15, it is preferable that a signal line (corresponding to the signal line 85 illustrated in FIG. 9) and electrodes (electrodes 88 and 89 illustrated in FIG. 9) of the converter 80D are connected together via a resistor. The resistance of the resistor used here can be selected as appropriate so that the reflection at the converter 80D is reduced. Note that, in cases where the converter 80D is terminated, the shape of its signal line can also be changed as appropriate.

<Effect Brought about by Filter 601C>

The diplexer 600 not only includes the filters 601A and 601B whose passband is the band $f_1$ but also the filter 601C whose passband is the band $f_2$. Therefore, the diplexer 600 is capable of improving isolation characteristics between the port P3 and the port P9 as compared to the diplexer 100 illustrated in FIG. 1.

A first application example of the diplexer 600 can be an arrangement in which an antenna circuit is connected to the port P2, a Tx is connected to the port P3, and an Rx is connected to the port P9. It is assumed here that the operation band of the Tx is the band $f_1$, the operation band of the Rx is the band $f_2$, and the operation bands of the antenna circuit are the band $f_1$ and the band $f_2$. This application example, in which the diplexer 600 includes the filter 601C, is capable of improving isolation characteristics between the Tx and the Rx. It follows that, even in cases where the intensity of a radio wave within the band $f_2$ received by the Rx is weaker, the Rx is capable of dealing with the received radio wave within the band $f_2$.

Note that, although the first application example discussed here is an arrangement in which a Tx is connected to the port P3 and an Rx is connected to the port P9, the following arrangement may alternatively be employed as a second application example: an Rx is connected to the port P3 and a Tx is connected to the port P9. In this arrangement, the operation band of the Rx is the band $f_1$, and the operation band of the Tx is the band $f_2$. Note, however, that when the two application examples are compared, the first application example is more advantageous. This is because, according to the first application example, the Rx, which deals with weaker radio waves, can be located near the antenna circuit, and the Tx, which deals with stronger radio waves, can be located away from the antenna circuit.

Furthermore, each of the resonators 610C, 620C, 630C, 640C, and 650C of the filter 601C is located on the circumference of the reference circle C, as described earlier. This arrangement makes it possible, in cases where the substrate that includes the diplexer 600 is in the shape of a rectangle, to reduce the dimension in the lengthwise direction of the substrate as compared to a diplexer 800 in which each of resonators 820C, 830C, 840C, and 850C is not located on the circumference of the reference circle C (the diplexer 800 will be described later with reference to FIG. 18). As such, the diplexer 600 can be contained in a more compact substrate. That is, it is possible to design a more compact diplexer.

Furthermore, in the filter 601C, the broad walls of each of the resonators 610C, 620C, 630C, 640C, and 650C are in the shape of a circle. In addition, two resonators which are coupled together (e.g., the resonators 610C and 620C) are arranged such that the relationship D<R1+R2 is satisfied, where R1 and R2 represent the radii of the circumcircles of the broad walls of these two resonators and D represents the center-to-center distance between the two resonators. This relationship between the radii and the center-to-center distance holds also for the resonators 620C and 630C, the resonators 630C and 640C, and the resonators 640C and 650C. This arrangement makes it possible to increase the symmetry of two resonators coupled together, as compared to cases in which resonators whose broad walls are in a quadrangular shape are employed. It follows that the number of design parameters for designing a diplexer can be reduced. Thus, the filter 601C allows for easy design of a filter with desired characteristics, as with the case of the filter 1.

Note that the number of resonators of the filter 601C is not limited to five, and can be changed appropriately so that desired transmission characteristics are achieved. Also, the shape of the broad walls that form the filter 601C is not limited to a circle, and may be a regular polygon with six or more vertices.

(Directional Couplers 606Aa and 606Ba)

The following description will discuss directional couplers 606Aa and 606Ba, which are variations of the directional couplers 606A and 606B, with reference to FIG. 16. FIG. 16 is a plan view of the directional coupler 606Aa. The directional coupler 606Ba is obtained by moving the directional coupler 606Aa such that the resulting directional coupler (directional coupler 606Ba) and the directional coupler 606Aa are mirror symmetric about a zx plane that contains the center of the resonator 630A and the center of the resonator 630B; therefore, descriptions for the directional coupler 606Ba are omitted here. The diplexer 600 illustrated in (b) of FIG. 15 may employ the directional coupler 606Aa illustrated in FIG. 17 instead of the directional coupler 606A, and may employ a directional coupler that is equal in configuration to the directional coupler 606Aa instead of the directional coupler 606B.

Note that the constituents of the directional coupler 606Aa which are identical to those of the directional coupler 606A are assigned the same reference numbers as those of the directional coupler 606A, and descriptions therefor are omitted.

The directional coupler 606Aa is different from the directional coupler 606A in that the directional coupler 606Aa further includes: conductor posts 687A1 to 687A4 which are a first additional conductor post group; and conductor posts 688A1 and 688A2 which are a second additional conductor post group.

Each of the conductor posts 687A1 to 687A4 and the conductor posts 688A1 and 688A2 is a conductor post provided within the substrate and is obtained by forming a conductor film on the inner wall of a through-hole passing through the substrate from one surface of the substrate to the opposite surface of the substrate. As such, the conductor posts 687A1 to 687A4 and the conductor posts 688A1 and 688A2 allow a pair of conductor layers on the opposite surfaces of the substrate to be in electrical communication with each other, as with the case of the conductor posts constituting the narrow walls 683A, 684A, and 685A.

As illustrated in FIG. 16, the conductor posts 687A1 and 687A2 are located at a position near a narrow wall 683A of a waveguide 681A where no waveguide aperture $AP_{680A}$ is present, and the conductor posts 687A3 and 687A4 are located near the narrow wall 683A of a waveguide 682A.

The conductor post 687A1 and the conductor post 687A2 are reflection symmetric about a line that is parallel to the x axis and that passes through the center of a conductor post 686A when the directional coupler 606Aa is seen in plan view. Similarly, the conductor post 687A3 and the conductor post 687A4 are reflection symmetric about a line that is parallel to the x axis and that passes through the center of the conductor post 686A when the directional coupler 606Aa is seen in plan view.

Furthermore, the conductor posts 687A1 and 687A2 and the conductor posts 687A3 and 687A4 are mirror symmetric about a line that is parallel to the y axis and that passes through the center of the conductor post 686A when the directional coupler 606Aa is seen in plan view.

Each of the conductor posts 687A1 and 687A2 thus arranged is a projection that projects from the narrow wall 683A toward a narrow wall 684A. Each of the conductor posts 687A3 and 687A4 thus arranged is a projection that projects from the narrow wall 683A toward a narrow wall 685A.

The directional coupler 606Aa, which further includes the conductor posts 687A1 to 687A4, is capable of improving input reflection coefficient and isolation characteristics at the operation band thereof as compared to the directional coupler 606A.

As illustrated in FIG. 16, the conductor post 688A1 is located near the narrow wall 684A, and the conductor post 688A2 is located near the narrow wall 685A. The conductor posts 688A1 and 688A2 and the conductor post 686A are aligned with each other in the y axis direction. The conductor post 688A1 and the conductor post 688A2 are reflection symmetric about a line that is parallel to the y axis and that passes through the center of the conductor post 686A when the directional coupler 606Aa is seen in plan view.

The conductor post 688A1 thus located is a projection that projects from the narrow wall 684A toward the center of the waveguide aperture $AP_{680A}$, and the conductor post 688A2 is a projection that projects from the narrow wall 685A toward the center of the waveguide aperture $AP_{680A}$.

The directional coupler 606Aa, which further includes the conductor posts 688A1 and 688A2, is capable of improving input reflection coefficient at the operation band thereof as compared to the directional coupler 606A.

Note that the position of the first additional conductor post group and the position of the second additional conductor post group can be optimized to improve input reflection coefficient and isolation characteristics, depending on various design parameters of the directional coupler 606Aa.

Further note that, although the directional coupler 606Aa in this variation includes both the first additional conductor post group and the second additional conductor post group, one of the first and second additional conductor post groups may be omitted in view of the input reflection coefficient and isolation characteristics.

Further note that the directional couplers 606Aa and 606Ba, each of which further includes the first additional conductor post group and the second additional conductor post group, are longer (larger in dimension along the y axis) than the directional couplers 606A and 606B. Because of this, the reference circle C in the diplexer 600, which includes the directional couplers 606Aa and 606Ba, is larger in diameter than the reference circle C in the diplexer 600 which includes the directional couplers 606A and 606B. In this case, each of the resonators 610C, 620C, 630C, 640C, and 650C may be located on the circumference of the reference circle C or may be located within the reference circle C. According to such arrangements, it is possible to achieve a compact diplexer 600 as compared to arrangements in which each of the resonators 610C, 620C, 630C, 640C, and 650C is located neither on the circumference of the reference circle C nor within the reference circle C (in other words, located outside the reference circle C).

Note that the directional couplers 606Aa and 606Ba can also be employed in diplexers 700 and 800, which will be described later with reference to FIGS. 17 and 18.

Embodiment 6

The following description will discuss a diplexer in accordance with Embodiment 6 of the present invention, with reference to FIG. 17. FIG. 17 is a plan view of the diplexer 700 in accordance with Embodiment 6.

The diplexer 700 is different from the diplexer 600 illustrated in (b) of FIG. 15 in that a directional coupler 706A that is different in shape from the directional coupler 606A of the diplexer 600 is employed in place of the directional coupler 606A and that a filter 701C that is different in shape from the filter 601C of the diplexer 600 is employed in place of the filter 601C. Therefore, Embodiment 6 discusses the directional coupler 706A and the filter 701C, and omits descriptions for filters 701A and 701B and a directional coupler 706B. Note that the filters 701A and 701B and the directional coupler 706B of the diplexer 700 correspond to the filters 601A and 601B and the directional coupler 606B of the diplexer 600, respectively.

<Filter 701C>

The filter 701C is comprised of five resonators each of which has rectangular broad walls, that is, resonators 710C, 720C, 730C, 740C, and 750C which are electromagnetically coupled via waveguide apertures $AP_{12C}$, $AP_{23C}$, $AP_{34C}$, and $AP_{45C}$. The resonator 710C has four faces constituted by: a narrow wall 711C and a narrow wall 712C which are a pair of narrow walls; and conductor layers (conductor layers on the opposite surfaces of a substrate) which are a pair of broad walls. The resonators 720C, 730C, 740C, and 750C are similar to the resonator 710C.

In the filter 701C, a waveguide aperture $AP_{IC}$, which is positioned downstream in the negative y axis direction, of the resonator 710C is electromagnetically coupled to the opposite end of a waveguide 781A (of the directional coupler 706A) from the filter 701A.

In the filter 701C, a waveguide aperture $AP_{OC}$, which is positioned downstream in the positive y axis direction, of the resonator 750C is electromagnetically coupled to a waveguide 760C. The waveguide 760C corresponds to the waveguide 670C of the filter 601C.

In Embodiment 6, each of the resonators 710C, 720C, 730C, 740C, and 750C is located so as to run along (in Embodiment 6, run parallel to) the y axis of the coordinate axes shown in FIG. 17 and so as to reside on the circumference of reference circle C. Note that, as with the case of the filter 601, a state in which a narrow wall of each of the resonators 710C, 720C, 730C, 740C, and 750C intersects or is in contact with the circumference of the reference circle C is referred to as a state in which each resonator is located on the circumference of the reference circle C. Note that, even in cases where a waveguide aperture in a resonator intersects the circumference of the reference circle C, such a resonator is regarded as being located on the circumference of the reference circle C.

<Directional Coupler 706A>

The directional coupler 706A includes the waveguide 781A and a waveguide 782A. The directional coupler 706A, the waveguide 781A, and the waveguide 782A correspond to the first directional coupler, the first waveguide, and the second waveguide recited in the claims, respectively.

A part, which runs along the waveguide 782A, of the waveguide 781A extends in the negative y axis direction from the filter 701A-side end (the end positioned downstream in the positive y direction). The waveguide 781A further extends in the negative y axis direction from the end, which is positioned downstream in the negative y axis direction, of the waveguide 782A, and then further extends such that the direction of its extension gradually changes from the negative y axis direction to the positive y axis direction via the negative x axis direction. The resulting shape of the waveguide 781A resembles the alphabetical letter "J".

Since the waveguide 781A has a shape like the letter J as described above, the directional coupler 706A and the filter 701A can be coupled to each other such that a loss is reduced, even in cases where the resonators 710C, 720C, 730C, 740C, and 750C are arranged in a straight line along the y axis.

The diplexer 700 thus arranged is capable of improving isolation characteristics between a converter 80A and a converter 80C as with the case of the diplexer 600, despite that the size of the substrate in which the diplexer 700 is contained (especially the dimension in the longitudinal direction) is larger than that of the diplexer 600.

Furthermore, when compared with the diplexer 800 (described later), the diplexer 700 can be contained in a more compact substrate.

Embodiment 7

The following description will discuss a diplexer in accordance with Embodiment 7 of the present invention, with reference to FIG. 18. FIG. 18 is a plan view of the diplexer 800 in accordance with Embodiment 7. As illustrated in FIG. 18, the diplexer 800 includes filters 801A, 801B, and 801C and directional couplers 806A and 806B.

The diplexer 800 is different from the diplexer 600 illustrated in FIG. 15 in that the filter 601C of the diplexer 600 is replaced with the filter 701C of the diplexer 700 illustrated in FIG. 17. Accordingly, the filters 801A and 801B and the directional couplers 806A and 806B correspond to the filters 601A and 601B and the directional couplers 606A and 606B of the diplexer 600, respectively, and the filter 801C corresponds to the filter 701C of the diplexer 700. Therefore, descriptions therefor are omitted in Embodiment 7.

Resonators 810C, 820C, 830C, 840C, and 850C of the filter 801C are arranged along (in Embodiment 7, in parallel to) a direction in which a waveguide 881A extends (i.e., in the negative y axis direction).

The diplexer 800 thus arranged is capable of improving isolation characteristics between a converter 80A and a converter 80C as with the case of the diplexers 600 and 700, despite that the size of the substrate in which the diplexer 800 is contained (especially the dimension in the longitudinal direction) is larger than those of the diplexers 600 and 700. In cases where the substrate in which the diplexer 800 is contained may be in the shape of a narrow rectangle that extends along the y axis, the arrangement of the diplexer 800 may be employed instead of the diplexer 600 or the diplexer 700.

The present invention is not limited to the embodiments, but can be altered by a skilled person in the art within the scope of the claims. The present invention also encompasses, in its technical scope, any embodiment derived by combining technical means disclosed in differing embodiments.

Aspects of the present invention can also be expressed as follows:

In order to attain the foregoing object, a diplexer (100, 600, 700, 800) in accordance with a first aspect of the present invention includes: a first directional coupler (106A, 606A, 706A, 806A) that is comprised of a first waveguide (160A, 681A, 781A, 881A) and a second waveguide (160B, 682A, 782A, 882A); a second directional coupler (106B, 606B, 706B, 806B) that is comprised of a third waveguide (170A, 681B, 781B, 881B) and a fourth waveguide (170B, 682B, 782B, 882B); a first filter (101A, 601A, 701A, 801A) that resides between the first waveguide and the third waveguide; and a second filter (101B, 601B, 701B, 801B) that resides between the second waveguide and the fourth waveguide. The first filter (101A, 601A, 701A, 801A) and the second filter (101B, 601B, 701B, 801B) each include a plurality of resonators (110A to 150A, 110B to 150B, 610A to 650A, 610B to 650B, 710A to 750A, 710B to 750B, 810A to 850A, 810B to 850B) that are electromagnetically coupled, the plurality of resonators (110A to 150A, 110B to 150B, 610A to 650A, 610B to 650B, 710A to 750A, 710B to 750B, 810A to 850A, 810B to 850B) each have a broad wall that is in a shape of a circle or a regular polygon with six or more vertices, and two resonators, which are coupled together, of the plurality of resonators (110A to 150A, 110B to 150B, 610A to 650A, 610B to 650B, 710A to 750A, 710B to 750B, 810A to 850A, 810B to 850B) are arranged such that $D < R_1 + R_2$ is satisfied, where $R_1$ and $R_2$ represent radii of circumcircles of the broad walls of the two resonators and D represents a center-to-center distance between the two resonators.

According to the above arrangement, the plurality of resonators of each of the first and second filters of the diplexer each have a broad wall in the shape of a circle or a regular polygon with six or more vertices. Therefore, even in cases where the widths of the first to fourth waveguides are set to certain values for the purpose of improving the characteristics of the diplexer, an increase in return loss at a junction between each waveguide and a corresponding filter (e.g., the junction between the first waveguide and the first filter) can be reduced as compared to conventional diplexers.

As such, it is possible to provide a diplexer in which the width of each of the waveguides of the directional couplers can be easily changed with little increase in return loss at the junction between each waveguide and a corresponding filter.

A diplexer (100, 600, 700, 800) in accordance with a second aspect of the prevent invention is preferably arranged such that the plurality of resonators include a first-pole resonator (110A, 110B, 610A, 610B, 710A, 710B, 810A, 810B) that has an input port (waveguide aperture $AP_I$) and a last-pole resonator (150A, 150B, 650A, 650B, 750A, 750B, 850A, 850B) that has an output port (waveguide aperture $AP_O$), and the plurality of resonators are arranged such that the first-pole resonator and the last-pole resonator are adjacent to each other.

According to the above arrangement, the total length of each filter can be reduced as compared to cases where the plurality of resonators are arranged in a straight line. This makes it possible to reduce the total length of the diplexer.

A diplexer (100, 600, 700, 800) in accordance with a third aspect of the present invention is preferably arranged such that: the plurality of resonators include a first-pole resonator (110A, 110B, 610A, 610B, 710A, 710B, 810A, 810B) that has an input port (waveguide aperture $AP_I$) and a last-pole resonator (150A, 150B, 650A, 650B, 750A, 750B, 850A, 850B) that has an output port (waveguide aperture $AP_O$); the first-pole resonator has a waveguide aperture that functions as the input port (waveguide aperture $AP_I$), the waveguide aperture being positioned on an opposite side of the first-pole resonator from the last-pole resonator such that the waveguide aperture intersects a straight line that passes through a center of the first-pole resonator and a center of the last-pole resonator; and the last-pole resonator has a waveguide aperture that functions as the output port (waveguide aperture $AP_O$), the waveguide aperture being positioned on an opposite side of the last-pole resonator from the first-pole resonator such that the waveguide aperture intersects the straight line.

According to the above arrangement, the input port and the output port are positioned so as to intersect the straight line that passes through the center of the first-pole resonator and the center of the last-pole resonator; therefore, the first filter can be suitably used as a filter that resides between the first waveguide and the third waveguide. Similarly, the second filter can be suitably used as a filter that resides between the second waveguide and the fourth waveguide.

In the above arrangement, by appropriately changing the position of the waveguide aperture functioning as the input port while ensuring that the waveguide aperture intersects the straight line, it is possible to reduce the return loss at the junction between the waveguide connected to the input port and the first-pole resonator. Also in the case of the output port, as with the case of the input port, it is possible to reduce the return loss at the junction between the waveguide connected to the output port and the last-pole resonator.

Accordingly, it is possible to provide a diplexer in which the width of each of the waveguides of the directional couplers can be easily changed with lesser increase in return loss at the junction between each waveguide and a corresponding filter.

A diplexer (100, 600, 700, 800) in accordance with a fourth aspect of the present invention may be arranged such that the number of the plurality of resonators (110A to 150A, 110B to 150B, 610A to 650A, 610B to 650B, 710A to 750A, 710B to 750B, 810A to 850A, 810B to 850B, 10b to 70b, 10d to 110d) is an odd number.

Each of the plurality of resonators is in the shape of a circle or a regular polygon with six or more vertices when seen in top view. Therefore, even in cases where the number of the plurality of resonators is an odd number, this filter can be arranged such that the plurality of resonators are symmetric with respect to a line. This makes it possible to reduce the number of design parameters for use in designing a filter, and thus makes it easy to design a filter.

A diplexer (100, 600, 700, 800) in accordance with a fifth aspect of the present invention is preferably arranged such that: each of the plurality of resonators (110A to 150A, 110B to 150B, 610A to 650A, 610B to 650B, 710A to 750A, 710B to 750B, 810A to 850A, 810B to 850B) is formed by a pair of the broad walls and a narrow wall that resides between the pair of broad walls; the pair of broad walls are constituted by a pair of conductor layers (602, 702, 802) provided on opposite surfaces of a dielectric substrate (103); and the narrow wall passes through the dielectric substrate and is constituted by a conductor post group (post walls; 113iA to 153iA, 113iB to 153iB) via which the pair of broad walls are in electrical communication with each other.

The above arrangement can be produced using a post-wall waveguide technique. The production of the filter using a post-wall waveguide technique is easier than the production of a filter using a metal waveguide tube technique, and also makes it possible to reduce weight.

A diplexer (100, 600, 700, 800) in accordance with a sixth aspect of the present invention is preferably arranged such that at least one of the plurality of resonators (110A to 150A, 110B to 150B, 610A to 650A, 610B to 650B, 710A to 750A, 710B to 750B, 810A to 850A, 810B to 850B) further includes a projection (314, 324, 334, 344, 354) made of a conductor, the projection projecting inward from one of a pair of the broad walls that form the at least one of the plurality of resonators.

According to the above arrangement, it is possible to change the resonance frequency of a resonator by adjusting the position of a projection and the amount of inward projection of the projection from one of the broad walls. Accordingly, it is possible to change the resonance frequency of this filter. This means that the position of a projection and the amount of projection of the projection can be used as design parameters for adjusting the characteristics of this filter. As such, the characteristics of this filter can be easily changed without having to change the design shapes of the respective plurality of resonators.

Note that the tip of the projection may reach the other one of the broad walls or may be located inside the resonator and be short of the other one of the broad walls.

A diplexer (600, 700, 800) in accordance with a seventh aspect of the present invention is preferably arranged such that: the first filter (101A, 601A, 701A, 801A) and the second filter (101B, 601B, 701B, 801B) each have a passband which is a first frequency band; and the diplexer (600, 700, 800) further includes a third filter (601C, 701C, 801C) that is comprised of a plurality of resonators (610A to 650A, 610B to 650B, 710A to 750A, 710B to 750B, 810A to 850A, 810B to 850B) electromagnetically coupled, that has a passband which is a second frequency band different from the first frequency band, and that is connected to an opposite side of the first waveguide from the first filter (101A, 601A, 701A, 801A).

According to the above arrangement, it is possible to improve the isolation characteristics between the opposite end of the third filter from the first waveguide and the opposite end of the third waveguide from the first filter.

A diplexer (600, 700) in accordance with an eighth aspect of the present invention is preferably arranged such that each of the plurality of resonators (610C to 650C, 710C to 750C) of the third filter (601C, 701C) is located on a circumference of a reference circle or located within the reference circle, the reference circle being any circle which encloses the first filter (601A, 701A) and the second filter (601B, 701B) and which has a diameter that is equal to or less than a distance from an opposite end of the second waveguide from the second filter (601B, 701B) to an opposite end of the fourth waveguide from the second filter (601B, 701B).

According to the above arrangement, it is possible to design a compact diplexer as compared to cases where one or more of the resonators of the third filter are located neither on the circumference of the reference circle nor within the reference circle.

A diplexer (600, 700, 800) in accordance with a ninth aspect of the present invention is preferably arranged such that: each of the plurality of resonators (610C to 650C, 710C to 750C, 810C to 870C) of the third filter (601C, 701C, 801C) has a broad wall that is in a shape of a circle or a regular polygon with six or more vertices; and two resonators, which are coupled together, of the plurality of resonators are arranged such that $d<r_1+r_2$ is satisfied, where $r_1$ and $r_2$ represent radii of circumcircles of the broad walls of the two resonators and d represents a center-to-center distance between the two resonators.

According to the above arrangement, when a focus is placed on two resonators, which are coupled together, of the plurality of resonators of the third filter, the shape of a combination of the circumcircles of the respective two resonators is symmetric with respect to a straight line that connects the centers of the two circumcircles. Therefore, the degree of symmetry of the shape of this filter is higher than that of the filter disclosed in Patent Literature 1. This makes it possible to reduce the number of design parameters.

Furthermore, according to the above arrangement, the shape of each of the broad walls that form the respective plurality of resonators of the third filter is in the shape of a circle or a regular polygon with six or more vertices. As such, this filter has a high degree of symmetry concerning the shape thereof. This makes it possible to reduce the number of design parameters.

Accordingly, this filter makes it possible to easily design a filter with desired characteristics, as compared to conventional filters.

A multiplexer in accordance with a tenth aspect of the present invention preferably includes a plurality of the diplexers (100, 600, 700, 800) described in any one of the foregoing aspects.

A multiplexer that includes a plurality of diplexers in accordance with an aspect of the present invention is also encompassed in the scope of the present invention.

REFERENCE SIGNS LIST 100, 100a, 100b, 600, 700, 800: diplexer
1, 101A, 101B, 601A, 601B, 601C, 701A, 701B, 701C, 801A, 801B, 801C: filter
106A, 106B, 606A, 606B, 706A, 706B, 806A, 806B: directional coupler
10, 20, 30, 40, 50, 110A, 120A, 130A, 140A, 150A, 110B, 120B, 130B, 140B, 150B, 610A, 620A, 630A, 640A, 650A, 610B, 620B, 630B, 640B, 650B, 710A, 720A, 730A, 740A, 750A, 710B, 720B, 730B, 740B, 750B, 810A, 820A, 830A, 840A, 850A, 810B, 820B, 830B, 840B, 850B: resonator
11, 12, 21, 22, 31, 32, 41, 42, 51, 52: broad wall 13, 23, 33, 43, 53: narrow wall
13i, 23i, 33i, 43i, 53i: conductor post
60, 70: waveguide
61, 62, 71, 72: broad wall
63, 64, 73, 74: narrow wall
63i, 64i, 73i, 74i: conductor post
65, 66, 75: short wall
80, 80A, 80B, 80C, 80D: converter (input converter and output converter)

The invention claimed is:

1. A diplexer comprising:
a first directional coupler that is comprised of a first waveguide and a second waveguide;
a second directional coupler that is comprised of a third waveguide and a fourth waveguide;
a first filter that resides between the first waveguide and the third waveguide; and
a second filter that resides between the second waveguide and the fourth waveguide,
the first filter and the second filter each including a plurality of resonators that are electromagnetically coupled,
the plurality of resonators each having a broad wall that is in a shape of a circle or a regular polygon with six or more vertices,
two resonators, which are coupled together, of the plurality of resonators being arranged such that $D<R_1+R_2$ is satisfied, where $R_1$ and $R_2$ represent radii of circumcircles of the broad walls of the two resonators and D represents a center-to-center distance between the two resonators,
wherein:
each of the plurality of resonators is formed by a pair of the broad walls and a narrow wall that resides between the pair of broad walls,
the pair of broad walls are constituted by a pair of conductor layers provided on opposite surfaces of a dielectric substrate, and
the narrow wall passes through the dielectric substrate and is constituted by a conductor post group via which the pair of broad walls are in electrical communication with each other.

2. The diplexer according to claim 1, wherein the plurality of resonators include a first-pole resonator that has an input port and a last-pole resonator that has an output port, and the plurality of resonators are arranged such that the first-pole resonator and the last-pole resonator are adjacent to each other.

3. The diplexer according to claim 1, wherein:
the plurality of resonators include a first-pole resonator that has an input port and a last-pole resonator that has an output port;
the first-pole resonator has a waveguide aperture that functions as the input port, the waveguide aperture being positioned on an opposite side of the first-pole resonator from the last-pole resonator such that the waveguide aperture intersects a straight line that passes through a center of the first-pole resonator and a center of the last-pole resonator; and
the last-pole resonator has a waveguide aperture that functions as the output port, the waveguide aperture being positioned on an opposite side of the last-pole resonator from the first-pole resonator such that the waveguide aperture intersects the straight line.

4. The diplexer according to claim 1, wherein the number of the plurality of resonators is an odd number.

5. The diplexer according to claim 1, wherein at least one of the plurality of resonators further includes a projection made of a conductor, the projection projecting inward from one of a pair of the broad walls that form the at least one of the plurality of resonators.

6. The diplexer according to claim 1, wherein:
the first filter and the second filter each have a passband which is a first frequency band; and
the diplexer further comprises a third filter that is comprised of a plurality of resonators electromagnetically coupled, that has a passband which is a second frequency band different from the first frequency band, and that is connected to an opposite end of the first waveguide from the first filter.

7. The diplexer according to claim 6, wherein each of the plurality of resonators of the third filter is located on a circumference of a reference circle or located within the reference circle, the reference circle being any circle which encloses the first filter and the second filter and which has a diameter that is equal to or less than a distance from an opposite end of the second waveguide from the second filter to an opposite end of the fourth waveguide from the second filter.

8. The diplexer according to claim 6, wherein:
each of the plurality of resonators of the third filter has a broad wall that is in a shape of a circle or a regular polygon with six or more vertices; and
two resonators, which are coupled together, of the plurality of resonators are arranged such that $d < r_1 + r_2$ is satisfied, where $r_1$ and $r_2$ represent radii of circumcircles of the broad walls of the two resonators and d represents a center-to-center distance between the two resonators.

9. A multiplexer comprising a plurality of the diplexers recited in claim 1.

10. A diplexer comprising:
a first directional coupler that is comprised of a first waveguide and a second waveguide;
a second directional coupler that is comprised of a third waveguide and a fourth waveguide;
a first filter that resides between the first waveguide and the third waveguide; and
a second filter that resides between the second waveguide and the fourth waveguide,
the first filter and the second filter each including a plurality of resonators that are electromagnetically coupled,
the plurality of resonators each having a broad wall that is in a shape of a circle or a regular polygon with six or more vertices,
two resonators, which are coupled together, of the plurality of resonators being arranged such that $D < R_1 + R_2$ is satisfied, where $R_1$ and $R_2$ represent radii of circumcircles of the broad walls of the two resonators and D represents a center-to-center distance between the two resonators,
wherein at least one of the plurality of resonators further includes a projection made of a conductor, the projection projecting inward from one of a pair of the broad walls that form the at least one of the plurality of resonators.

11. A diplexer comprising:
a first directional coupler that is comprised of a first waveguide and a second waveguide;
a second directional coupler that is comprised of a third waveguide and a fourth waveguide;
a first filter that resides between the first waveguide and the third waveguide; and
a second filter that resides between the second waveguide and the fourth waveguide,
the first filter and the second filter each including a plurality of resonators that are electromagnetically coupled,
the plurality of resonators each having a broad wall that is in a shape of a circle or a regular polygon with six or more vertices,
two resonators, which are coupled together, of the plurality of resonators being arranged such that $D < R_1 + R_2$ is satisfied, where $R_1$ and $R_2$ represent radii of circumcircles of the broad walls of the two resonators and D represents a center-to-center distance between the two resonators,
wherein:
the first filter and the second filter each have a passband which is a first frequency band; and
the diplexer further comprises a third filter that is comprised of a plurality of resonators electromagnetically coupled, that has a passband which is a second frequency band different from the first frequency band, and that is connected to an opposite end of the first waveguide from the first filter.

12. The diplexer according to claim 11, wherein each of the plurality of resonators of the third filter is located on a circumference of a reference circle or located within the reference circle, the reference circle being any circle which encloses the first filter and the second filter and which has a diameter that is equal to or less than a distance from an opposite end of the second waveguide from the second filter to an opposite end of the fourth waveguide from the second filter.

13. The diplexer according to claim 11, wherein:
each of the plurality of resonators of the third filter has a broad wall that is in a shape of a circle or a regular polygon with six or more vertices; and
two resonators, which are coupled together, of the plurality of resonators are arranged such that $d < r_1 + r_2$ is satisfied, where $r_1$ and $r_2$ represent radii of circumcircles of the broad walls of the two resonators and d represents a center-to-center distance between the two resonators.

* * * * *